US011901888B1

(12) United States Patent
Chendake et al.

(10) Patent No.: US 11,901,888 B1
(45) Date of Patent: Feb. 13, 2024

(54) GATE CHARGE PROFILER FOR POWER TRANSISTORS

(71) Applicant: Infineon Technologies Austria AG, Villach (AT)

(72) Inventors: Vedant Sadashiv Chendake, Lengkong Tujoh (SG); Giuseppe Bernacchia, Villach (AT); Pablo Yelamos Ruiz, Hermosa Beach, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/872,125

(22) Filed: Jul. 25, 2022

(51) Int. Cl.
*H03K 17/687* (2006.01)
*H03K 5/24* (2006.01)

(52) U.S. Cl.
CPC ............. *H03K 17/687* (2013.01); *H03K 5/24* (2013.01)

(58) Field of Classification Search
CPC ........ H03K 17/687; H03K 5/24; G05F 1/571; H02H 9/04; H02H 3/20
See application file for complete search history.

(56) References Cited

U.S. PATENT DOCUMENTS 9,746,892 B2 * 8/2017 Fukumoto ............... G06F 1/263

FOREIGN PATENT DOCUMENTS

DE   102019218998 A1   6/2021

OTHER PUBLICATIONS

Extended European Search Report of Corresponding Application No. EP23187233; dated Nov. 27, 2023; 8 Pgs.

* cited by examiner

*Primary Examiner* — Jung Kim
(74) *Attorney, Agent, or Firm* — COOPER LEGAL GROUP, LLC

(57) ABSTRACT

A gate charge profiler for a power transistor may include a voltage comparator unit and a timer unit. An input signal may control a gate drive current input to a gate of the power transistor to control conduction between a drain and a source of the power transistor. The voltage comparator unit may be configured to compare an input voltage and a threshold voltage, and to output a comparison signal. The input voltage may be a drain-source voltage across the drain and the source of the power transistor or a gate-source voltage across the gate and the source of the power transistor. The timer unit may be configured to output a time value based on input of a transition of the input signal and input of the comparison signal.

26 Claims, 16 Drawing Sheets

MOSFET Gate Charge (Datasheet)

| Parameter | Symbol | Min. | Typ. | Max. | Unit | Note / Test Condition |
|---|---|---|---|---|---|---|
| Gate charge at threshold | Qg(th) | - | 11 | - | nC | Vdd=20V, Id=50A, Vgs=0 to 10V |
| Gate to drain charge | Qgd | - | 15 | 21 | nC | Vdd=20V, Id=50A, Vgs=0 to 10V |
| Switching charge | Qsw | - | 21 | - | nC | Vdd=20V, Id=50A, Vgs=0 to 10V |
| Gate charge total (design) | Qg | - | 95 | 133 | nC | Vdd=20V, Id=50A, Vgs=0 to 10V |

910

MOSFET Gate Charge (Datasheet)

| Parameter | Symbol | Min. | Typ. | Max. | Unit | Note / Test Condition |
|---|---|---|---|---|---|---|
| Gate to source charge | Qgs | - | 20 | - | nC | Vdd=40V, Id=50A, Vgs=0 to 10V |
| Gate charge at threshold | Qg(th) | - | 12 | - | nC | Vdd=40V, Id=50A, Vgs=0 to 10V |
| Gate to drain charge | Qgd | - | 13 | 19.5 | nC | Vdd=40V, Id=50A, Vgs=0 to 10V |
| Switching charge | Qsw | - | 21 | - | nC | Vdd=40V, Id=50A, Vgs=0 to 10V |
| Gate charge total (design) | Qg | - | 61 | 76 | nC | Vdd=40V, Id=50A, Vgs=0 to 10V |
| Gate plateau voltage | Vplateau | - | 4.6 | - | V | Vdd=40V, Id=50A, Vgs=0 to 10V |

FIG. 9B

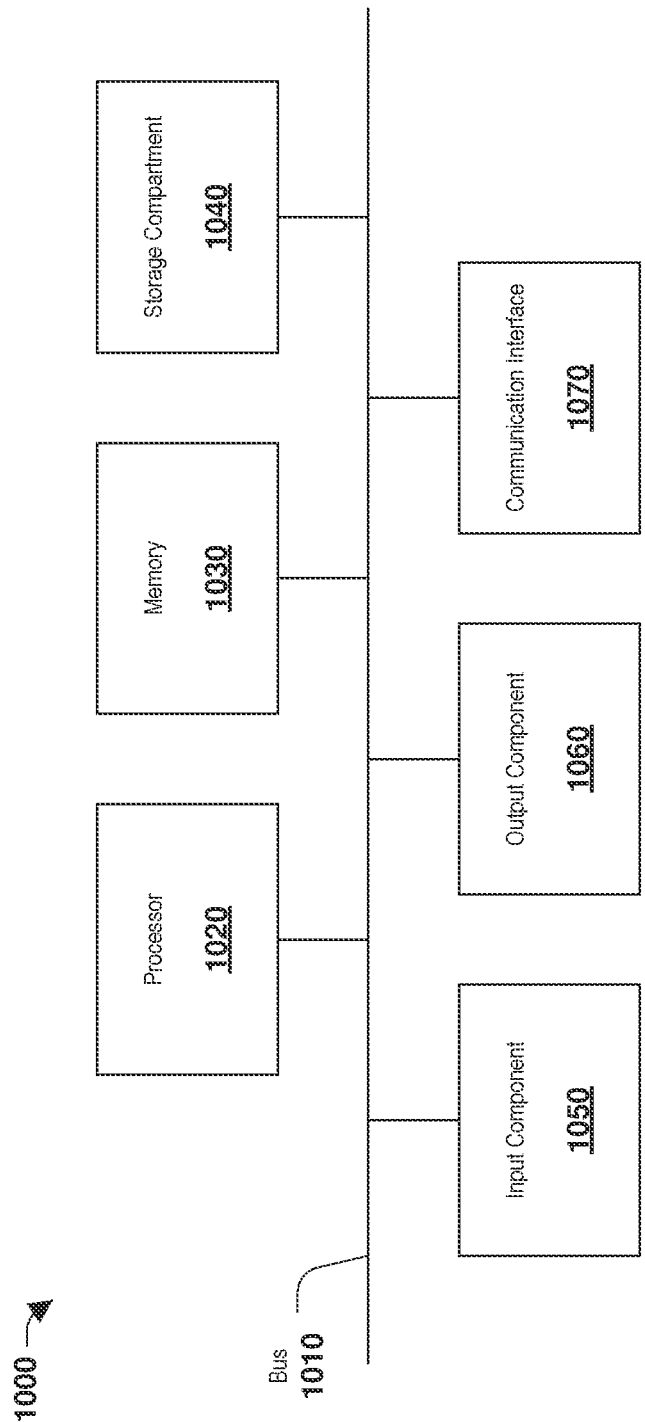

GATE CHARGE PROFILER FOR POWER TRANSISTORS

TECHNICAL FIELD

The present disclosure relates generally to power electronics systems.

BACKGROUND

Power electronics systems may include circuit elements such as power transistors and gate drivers to provide power and control to power devices. Examples of power devices that use such power transistors and gate drivers include switched-mode power supplies (SMPSs), brushless DC (BLDC) motors, wireless charging devices, etc. Power transistors may transition between ON and OFF states in response to an applied gate drive current, which may depend upon gate charge characteristics of the power transistors.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a device may include a gate charge profiler circuit. A current input terminal may be configured to receive an input signal that controls a gate drive current, wherein the gate drive current drives a gate of a power transistor to control conduction between a drain and a source of the power transistor. A comparator input terminal may be configured to receive an input voltage, wherein the input voltage is a drain-source voltage across the drain and the source or a gate-source voltage across the gate and the source. A threshold voltage terminal may be configured to receive a threshold voltage. A voltage comparator unit, having a first comparator input coupled to the comparator input terminal and a second comparator input coupled to the threshold voltage terminal, may be configured to generate a comparison signal based on a comparison of the input voltage and the threshold voltage. A timer unit, having a first timer input coupled to the current input terminal and a second timer input coupled to a comparator output of the voltage comparator unit, may be configured to determine a time value based on input of a transition of the input signal and input of the comparison signal, wherein a gate charge of the power transistor corresponds to the gate drive current and the time value.

According to some embodiments, a gate charge profiler system may include a power transistor that includes a gate that controls conduction between a drain and a source, and a gate driver configured drive the gate of the power transistor with a gate drive current in response to an input signal. The system may further include a gate charge profiler including an analog comparator configured to generate a comparison signal when a drain-source voltage across the drain and the source equals a threshold voltage, and a timer arranged subsequent to the analog comparator and configured to output a time value based on input of a transition of the input signal and input of the comparison signal. The system may further include a controller, configured to output the input signal to the gate driver and the timer, and to calculate a value of a gate charge of the power transistor based on the gate drive current and the time value.

According to some embodiments, a method may include driving, by a gate driver, a gate of a power transistor with a gate drive current in response to an input signal to control conduction between a drain and a source of the power transistor, and comparing, by a voltage comparator unit, a drain-source voltage across the drain and the source and a threshold voltage to generate a comparison signal. The method may further include determining, by a timer unit, a time value based on input of a transition of the input signal and input of the comparison signal, and calculating, by a controller, a value of a gate charge of the power transistor based on the gate drive current and the time value.

According to some embodiments, an apparatus is provided. The apparatus includes means for driving a gate of a power transistor with a gate drive current in response to an input signal to control conduction between a drain and a source of the power transistor. The apparatus includes means for comparing a drain-source voltage across the drain and the source and a threshold voltage to generate a comparison signal. The apparatus includes means for determining a time value based on input of a transition of the input signal and input of the comparison signal. The apparatus includes means for calculating a value of a gate charge of the power transistor based on the gate drive current and the time value.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIGS. 9A-9B are illustrations of tested gate charge characteristics for a sample power transistor, according to some embodiments.

FIG. 10 is a diagram of example components of a device, according to some embodiments.

DETAILED DESCRIPTION

Figure 1:
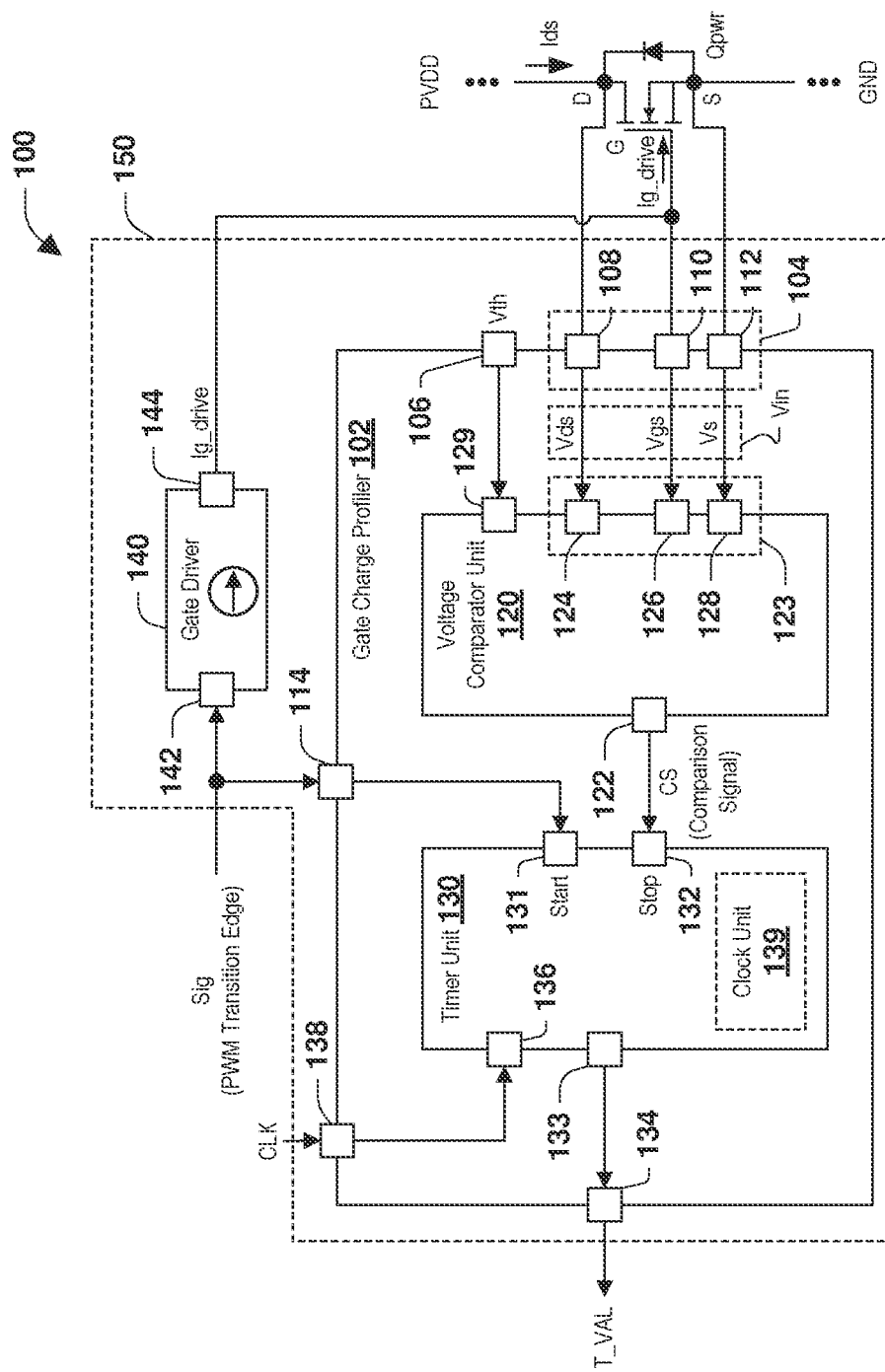
FIG. 1 illustrates a system including a gate charge profiler and a power transistor, according to some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

Aspects of the disclosure are directed to techniques for determining gate drive characteristics of power transistors in power electronics systems. Power transistors may be used in SMPSs, BLDC motor drive inverters, other types of inverters, DCDC converters, ACDC converters, or other types of power electronics systems. Switching losses in power electronics systems, produced by gate drive currents, may be reduced by a tradeoff between efficiency optimization and reduction of electromagnetic interference (EMI). Switching behavior of power transistors may be controlled by controllers, such as slew rate controllers. A slew rate controller typically controls a gate drive current of a power transistor (e.g., a metal oxide semiconductor field effect transistor (MOSFET)) to turn ON and OFF, which may then achieve a desired slew rate. In some embodiments, the gate drive current may be controlled using external components such as gate resistors and snubber circuits. In some embodiments, the gate drive current may be controlled more precisely using an integrated circuit, also known as a smart gate driver IC, which may configure different gate drive currents at different time intervals to achieve higher efficiency and limit EMI.

A slew rate controller may be configured based on an effective gate charge of a connected power transistor. Power transistors are often accompanied by a device datasheet provided by the manufacturer that may set forth a gate charge, which may be defined by design conditions, testing conditions, or other conditions. However, gate charge characteristics may vary between power transistors and therefore may not align with the device datasheet. Moreover, to achieve optimal switching performance, the effect of parasitics on the gate charge beyond those provided in the device datasheet may be considered. The identification of parasitic elements in power electronics systems is a challenging and time consuming process. Parasitics elements may vary based on individual power transistor packaging, PCB routing, proximity to other circuit elements, and/or other factors that are resident in-system. In general, parasitics can be minimized but cannot be eliminated. Hence, it is desirable to determine gate charge characteristics of in-system power transistors, which may include variations of individual in-system power transistor parameters, the effects of parasitics, and/or other factors.

By determining the gate charge characteristics of in-system power transistors, switching performance may be optimized and slew rates of applied gate drive currents may be tuned. For example, different gate drive current may be varied and applied to the gate of a power transistor during different time intervals to optimize switching performance. Also, switching performance may vary based on multiple parameters such as temperature variations, load current variations, etc. This makes determination of optimal switching more challenging. Embodiments of the present disclosure may provide switching that may be adapted as per parameter variations, which may or may not occur during in-system operation. Embodiments of the present disclosure may detect gate charges of in-system power transistors while considering the effects of parasitic elements. Embodiments of the present disclosure may use calibrated gate charge characteristics of in-system power transistors to configure gate current settings, such as applied current values and time intervals, and thereby optimize switching performance.

Because measurement of parasitic elements in-system is complex, significant current and voltage margins may be typically designed for in-system power transistors to mitigate potential system damage, which may occur due to overshoot or undershoot of power transistor voltages. However, such margins of in-system power transistor design may also impact efficiency of switching performance and overall system performance. For example, design margins may penalize MOSFET voltage ratings such that a particular MOSFET may be chosen for an application with a higher voltage rating. Such higher voltage ratings may impact other system and/or power transistor parameters, which may lead to higher losses and reduced efficiency. An example MOSFET parameter that may vary with voltage rating is a drain-source resistance RdsON, which is the total resistance between the drain and the source when the MOSFET is ON. The RdsON value may be used as a basis for a maximum current rating of the MOSFET and may also be associated with current loss. Embodiments of the present disclosure may reduce design margins to achieve higher efficiency and reduce current loss while maintaining EMI within design limits. Embodiments of the present disclosure may determine effective gate charges of in-system MOSFETS, and determine switching behavior for specific MOSFET conditions (e.g., PCB board layout, MOSFET manufacture process, in-system temperature, in-system parasitics, etc.) without limitation of design margins imposed by generic MOSFET datasheet parameters.

FIG. 1 illustrates a system including a gate charge profiler and a power transistor, according to some embodiments. In the example of FIG. 1, a system 100 includes a gate charge profiler 102 that includes a voltage comparator unit 120 and a timer unit 130. In some embodiments, the gate charge profiler 102 may be configured as a gate charge circuit including discrete circuit elements. In some embodiments, the gate charge profiler 102 may be configured as a device, an integrated circuit, and/or a component of thereof. The gate charge profiler 102 may be configured to receive an input voltage Vin from a comparator input terminal 104 and a threshold voltage Vth from a threshold voltage terminal 106. The comparator input terminal 104 may be coupled to at least one of a drain-source voltage Vds across a drain D and a source S of a power transistor Qpwr or a gate-source voltage Vgs across a gate G and the source S of the power transistor Qpwr. In some embodiments, the comparator input terminal 104 includes a Vds terminal 108 coupled to receive the drain-source voltage Vds, a Vgs terminal 110 coupled to receive the gate-source voltage Vgs, and a Vs terminal 112 coupled to receive a source voltage Vs from the source S of the power transistor Qpwr. The gate charge profiler 102 may include a current input terminal 114 configured to receive an input signal Sig, such as a current-setting signal, wherein the input signal Sig may control a gate drive current Ig_drive input to the gate G of the power transistor Qpwr. In some embodiments, the input signal Sig controls a current value and/or a time interval of the gate drive current Ig_drive. The gate drive current Ig_drive may drive and charge the gate G to control conduction between the drain D and the source terminal S of the power transistor Qpwr.

According to some embodiments, the gate charge profiler 102 includes a voltage comparator unit 120 having a first comparator input 123 coupled to the comparator input terminal 104 and a second comparator input 129 coupled to the threshold voltage terminal 106. The voltage comparator unit 120 may be configured to generate a comparison signal CS based on a comparison of the input voltage Vin and the threshold voltage Vth, and output the comparison signal CS at a comparator output 122. As set forth in greater detail herein, the input voltage Vin may ramp upward or downward and the comparison signal CS output by the voltage comparator unit may ramp upward when the input voltage Vin equals the threshold voltage Vth. In some embodiments, the first comparator input 123 includes a comparator Vds terminal 124 coupled to the Vds terminal 108, a comparator Vgs terminal 126 coupled to the Vgs terminal 110, and a comparator Vs terminal 128 coupled to the Vs terminal 112.

According to some embodiments, the gate charge profiler 102 includes a timer unit 130 arranged subsequent to the voltage comparator unit 120. The timer unit 130 may include a first timer input 131, Start, coupled to the current input terminal 114 to receive the input signal Sig and a second timer input 132, Stop, coupled to the comparator output 122 to receive the comparison signal CS. The timer unit 130 is configured to determine a time value T_VAL at a timer output 133 based on input of a transition of the input signal Sig and input of the comparison signal CS. In some embodiments, the input signal Sig is a pulse-width-modulated (PWM) signal and the timer unit 130 starts determination of the time value T_VAL based on a transition edge of the PWM signal and stops determination of the time value T_VAL based on a transition edge of the comparison signal CS. In some embodiments during a turn ON process for the power transistor Qpwr, the timer unit 130 starts determination of the time value T_VAL based on a rising or transition edge of the PWM signal and stops determination of the time value T_VAL based on a rising or transition edge of the comparison signal CS. The timer output 133 is coupled to a time value output terminal 134 of the gate charge profiler 102 to output the time value T_VAL. In some embodiments, a value of a gate charge of the power transistor Qpwr corresponds to the gate drive current Ig_drive and the time value T_VAL.

According to some embodiments, the input signal Sig transitions from an OFF state to an ON state to control the gate drive current Ig_drive to drive the gate G of the power transistor Qpwr and turn the power transistor Qpwr ON. The voltage comparator unit 120 may generate the comparison signal CS when the input voltage Vin slews from an initial input voltage to the threshold voltage Vth. As set forth herein to turn the power transistor Qpwr ON, the initial input voltage may be an initial drain-source voltage Vds across the drain D and the source S of the power transistor Qpwr or an initial gate-source voltage Vgs across the gate G and the source S of the power transistor Qpwr. According to some embodiments, the input signal Sig transitions from an ON state to an OFF state to control the gate drive current Ig_drive to stop driving the gate G of the power transistor Qpwr and turn the power transistor OFF. The voltage comparator unit 120 may generate the comparison signal CS when the input voltage Vin slews from an initial input voltage to the threshold voltage Vth. As set forth herein to turn the power transistor Qpwr OFF, the initial input voltage may be an initial drain-source voltage Vds across the drain D and the source S of the power transistor Qpwr or an initial gate-source voltage Vgs across the gate G and the source S of the power transistor Qpwr.

In some embodiments, the timer unit 130 includes a clock input 136, coupled to a clock input terminal 138 of the gate charge profiler 102, to receive a clock signal CLK from a source external to the gate charge profiler 102. The timer unit 130 may initiate determination of the time value T_VAL, with reference to the clock signal CLK, based on input of the input signal Sig and may end determination of the time value T_VAL, with reference to the clock signal CLK based on input of the comparison signal CS. In some embodiments, the timer unit 130 includes a clock unit 139, such as a crystal oscillator or a voltage-controlled oscillator, to generate the clock signal CLK. The time value T_VAL may have a value corresponding to a number of pulses of the clock signal CLK. For example, the clock signal CLK may have a clock period Tclk that is preferably less than 500 nano seconds (nS), more preferably less than 200 nS, and still more preferably less than 100 ns. In some embodiments, the clock signal CLK has a clock period Tclk of 60 nS, with a clock high time Tclk_high of 20 nS and a clock low time Tclk_low of 20 nS and with 10 nS transitions (e.g., a clock signal rising edge and/or a clock signal falling edge) between the clock high time Tclk_high and the clock low time Tclk_low. The timer unit 130 may be configured with a data setup time Tset_sdi of 10 nS to respond to the input signal Sig and an input data hold time Thd_sdi of 10 nS to respond to the comparison signal CS. In some embodiments, set forth in greater detail below, the gate drive current Ig_drive may experience a propagation delay PD before response to the control signal CS. In such embodiments, the data setup time Tset_sdi and the data hold time Thd_sdi may be less than the propagation delay PD of the gate drive current Ig_drive to provide a more accurate determination of the time value T_VAL by the timer unit 130.

In some embodiments, the input signal Sig is a PWM signal that has a defined duty cycle and frequency. The PWM signal may have a signal period Tsig greater than the clock period Tclk. The signal period Tsig may vary depending upon an in-system application of the power transistor Qpwr. For example, in an application of a BLDC power transistor, the signal period Tsig may correspond to a frequency between 5 KHz and 100 KHz, and more preferably between 10 KHz and 60 KHz. In another example of an SMPS, the signal period Tsig may correspond to a frequency between 100 KHz and 10 MHz, and more preferably between 1 MHz and 10 MHz. In another example of an application of power transistors to wireless charging, the signal period Tsig may correspond to a frequency between 1 MHz and 5 MHz. In some embodiments, the timer unit 130 initiates determination of the time value T_VAL based on a transition edge of the PWM signal. For example, the timer unit 130 may initiate determination of the time value T_VAL based on a comparison of a component of the clock signal CLK, such as the clock high time Tclk_high or the clock low time Tclk_low, and the transition edge of the PWM signal. In another example, the timer unit 130 may initiate determination of the time value T_VAL based on a comparison of a rising or transition edge of the clock signal CLK, such as a transition from the clock low time Tclk_low to the clock high time Tclk_high, and the transition edge of the PWM signal. In some embodiments, determination of the time value T_VAL based on the transition edge of the PWM signal may provide a more accurate measurement of the time value T_VAL by the timer unit 130. Other arrangements and configurations of the timer unit 130, the clock signal CLK, and the PWM signal are within the scope of the present disclosure.

In some embodiments, the power transistor Qpwr is one of a MOSFET, an insulated gate bipolar transistor (IGBT), a static induction transistor (SIT), a bipolar junction transistor (BJT), junction-gate field-effect transistor (JFET), or other type of power device. Power electronics systems may include the power transistor Qpwr in half-bridge and/or full-bridge circuits. A full-bridge circuit comprises two half bridges configured in parallel. A half-bridge circuit includes a high-side and a low-side switch (power transistor) connected in series at a switching node between a voltage source and a reference node. For clarity of description, the reference node may be alternately referred to as ground GND. Half-bridge circuits may be used in a variety of SMPSs, including buck converters, boost converters, isolated flyback converters, resonant converters, etc. Half-bridge circuits may also be used in motor drive inverters to supply drive currents to electrical motors, such as BLDC motors, permanent-magnet synchronous motors (PMSMs), etc. In some embodiments, high and low-side switches in power electronics systems may be alternately switched, such that the high-side switch connects the voltage source to the switching node during a first conducting interval, and the low-side switch connects the switching node to the reference node during a second conducting interval. In some embodiments and in order to avoid connecting the voltage source directly to the reference node, the switches may not conduct at the same time. Hence, the first and second conducting intervals may be separated by a so-called "dead-time" interval, during which neither switch conducts. In some embodiments, efficiency of the system 100 may be increased by minimizing dead-time intervals such that a higher percentage of each switching cycle is used for transferring power. Reducing dead-time intervals may be achieved by appropriate setting of a gate drive current Ig_drive and a time interval for applying the gate drive current Ig_drive to the gate G of the power transistor Qpwr such that a corresponding gate control voltage of the power transistor approximates a square wave. Other arrangements and configurations for setting the gate drive current Ig_drive, and a time interval for applying the gate drive current Ig_drive to the power transistor Qpwr are within the scope of the present disclosure.

In some embodiments, a gate driver 140 is configured to output the gate drive current Ig_drive to the gate G of the power transistor Qpwr in response to the input signal Sig. The gate driver 140 may include a gate driver input 142 coupled to receive the input signal Sig and a gate driver output 144 coupled to the gate G of the power transistor Qpwr. In some embodiments, the gate driver 140 is configured to drive the gate G of the power transistor Qpwr with the gate drive current Ig_drive based on a current level indicated by the input signal Sig. In some embodiments, the gate driver 140 and the gate charge profiler 102 may be included in a gate driver IC 150. In some embodiments, the gate driver 140 and the gate charge profiler 102 may be included in a micro control unit (MCU) that includes an internal timer unit, an internal analog comparator, and an internal gate driver IC with slew rate control. In such embodiments, the MCU may be programmed to determine the gate charge characteristics with the gate charge profiler 102, and control a current value of the gate drive current Ig_drive output by the gate driver 140 with one or more programmable input signals. The one or more input signals may include one or more programmable current values and/or one or more programmable time intervals. In some embodiments as set forth in greater detail herein, the gate charge profiler 102 may be implemented with one or more comparators and one or more timers with a closer physical location to the power transistor Qpwr, where Vgs and Vds sensing can be implemented with higher precision.

In some embodiments, the gate driver 140 may provide slew rate control of the gate drive current Ig_drive in response to the input signal Sig by sourcing and sinking gate drive currents with different gate drive currents at different time intervals. In some embodiments, the different gate drive currents and different time intervals may be based on a calculated gate charge of the power transistor Qpwr (e.g., a high-side MOSEFET or a low-side MOSFET). For example, the gate driver 140 may be configured to output the gate drive current Ig_drive, indicated by the input signal Sig, to provide:

IH_src: a gate driver current for switching ON high-side MOSFETs,
IH_sink: a gate driver current for switching OFF high-side MOSFETs,
IL_src: a gate driver current for switching ON low-side MOSFETs,
IL_sink: a gate driver current for switching OFF low-side MOSFETs,
Ipre_src: a pre-charge gate driver current for switching ON both high-side and low-side MOSFETs,
Ipre_sink: a pre-discharge gate driver current for switching OFF both high-side and low-side MOSFETs,
Tdrive1: a time interval to apply Ipre_src,
Tdrive2: a time interval to apply IH_src and IL_src,
Tdrive3: a time interval to apply Ipre_sink, and
Tdrive4: a time interval to apply IH_sink and IL_sink.

Other arrangements and configurations of different gate drive currents and different time intervals are within the scope of the present disclosure.

Figure 2A:
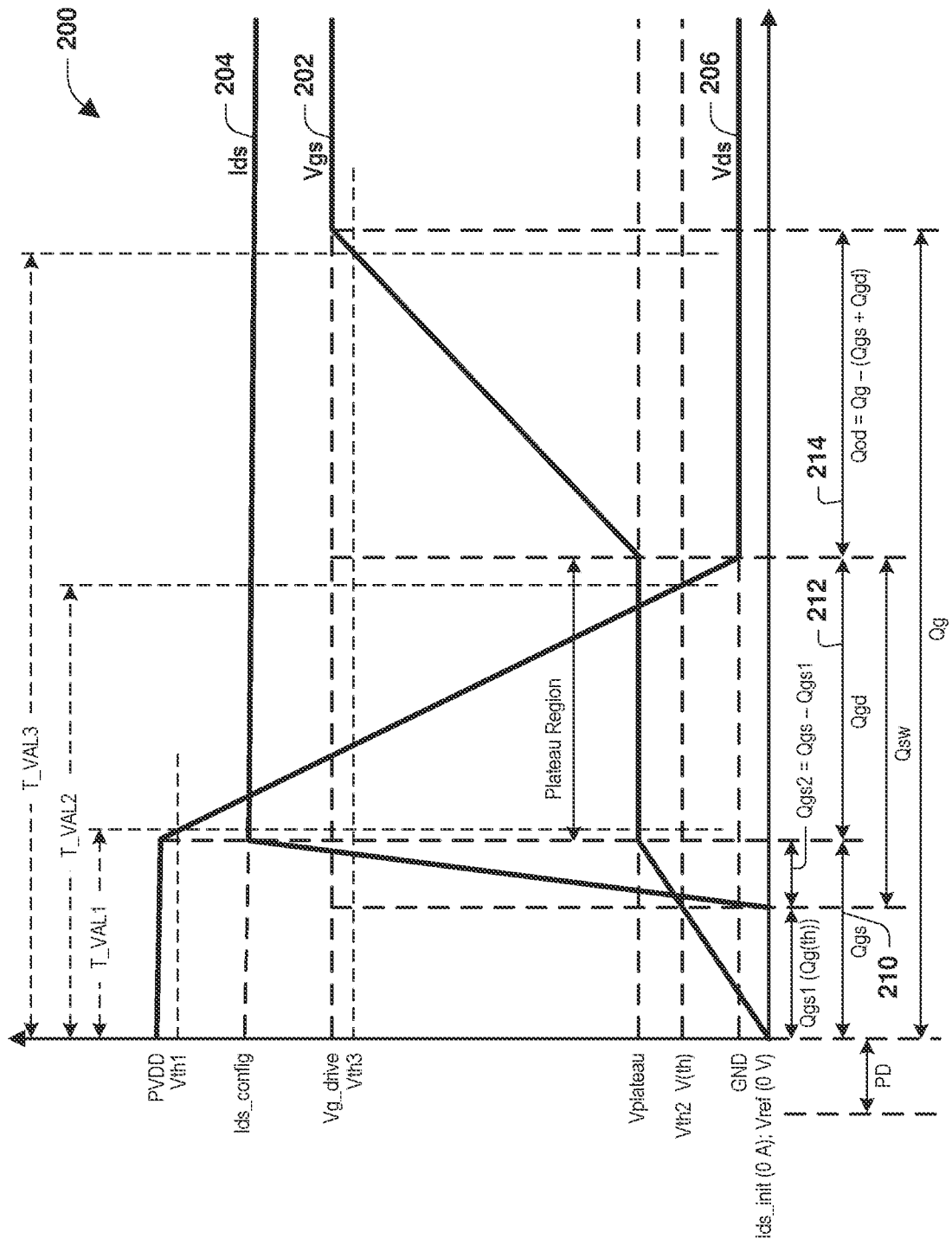
FIGS. 2A and 2B are graphs illustrating gate charge characteristics of a power transistor, according to some embodiments.
Figure 2B:
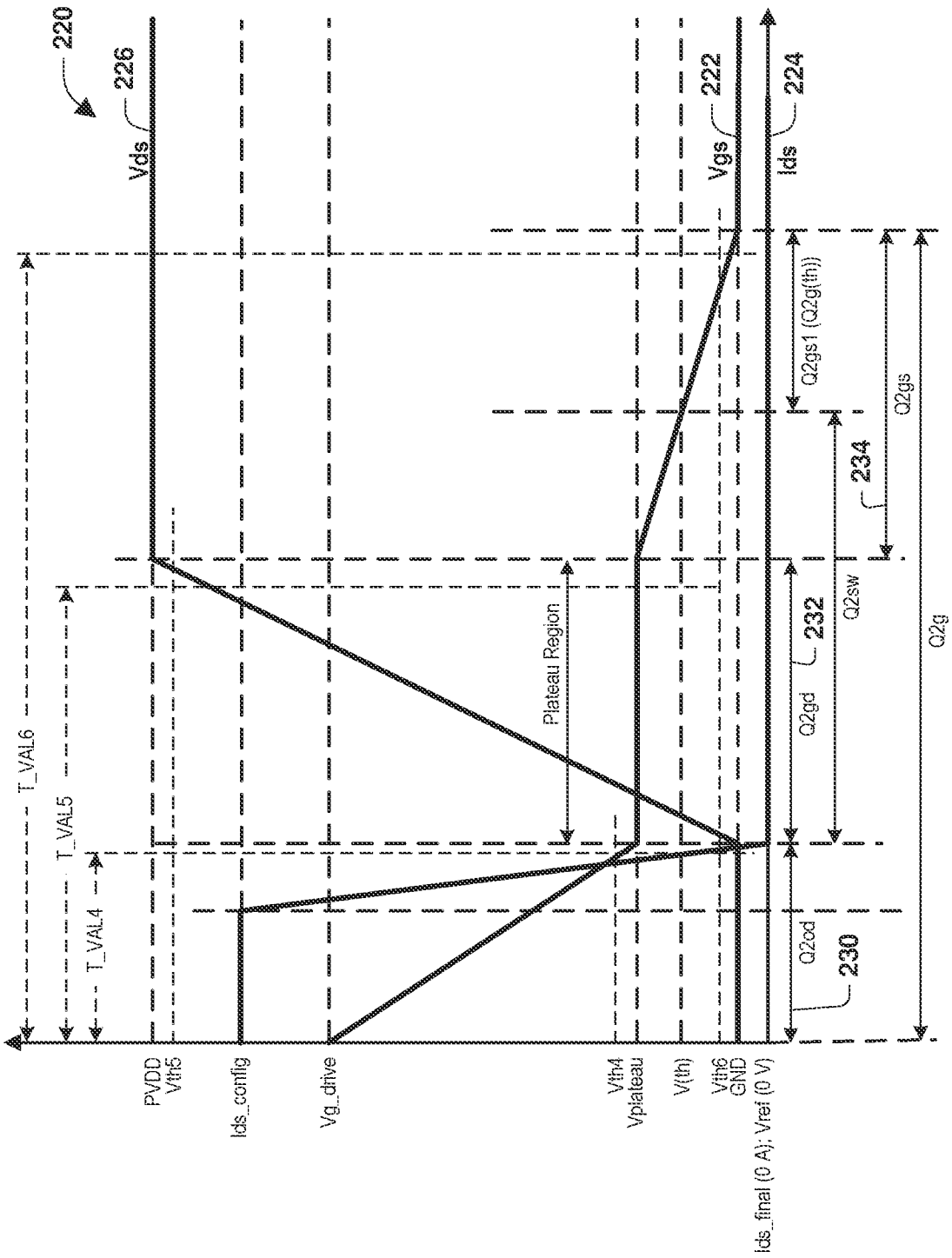

FIGS. 2A and 2B are graphs illustrating gate charge characteristics of a power transistor, according to some embodiments. In the example of FIG. 2A, a graph 200 illustrates gate charge characteristics of a power transistor in a power electronics system during a turn ON process. In the example of FIG. 2A, the power transistor may be the power transistor Qpwr configured as a high-side power transistor in a half-bridge configuration. The effective gate charge may be measured by running a gate charge calibration phase before or during startup of the system 100. During the calibration phase, the power transistor Qpwr may be turned ON with a relatively low and constant reference current Ig_drive_ref. With a lower reference current Ig_drive_ref, a longer time interval may be provided for the power transistor Qpwr to turn ON than used during operation to enhance determination of gate charge characteristics. For example, after the calibration phase, the power transistor Qpwr may be operated with an operation current Ig_drive_op applied during a time interval, which may be set according to the determined gate charge characteristics. Hence, a longer time interval using the reference current Ig_drive_ref for turn ON/OFF of the power transistor Qpwr may provide more precise measurement of time values, which may provide more accurate calculation of gate charge values. The power transistor Qpwr may include predetermined design parameters, such as a maximum gate drive current Ig_drive_max, which is acceptable before risk of failure, and a minimum gate drive current Ig_drive_min, which may trigger the gate-source voltage Vgs to turn the power transistor ON. In some embodiments, the reference current Ig_drive_ref is the minimum gate drive current Ig_drive_min. In some embodiments, the reference current Ig_drive_ref is another value below the operation current Ig_drive_op and equal to or above the minimum gate drive current Ig_drive_min. For example, a power transistor may be configured to accept a drain-source voltage Vds having a value of 40 V, a maximum gate drive current Ig_drive_max of 1.5 A, and a minimum gate drive current Ig_drive_min of 50 mA. In this example, the minimum gate drive current Ig_drive_min may be used as the reference current Ig_drive_ref during the calibration phase to determine in-system gate charge characteristics, while the operation current Ig_drive_op, configured below the maximum gate drive current Ig_drive_max, may be used during operation of the power transistor Qpwr.

With reference to the graph 200 of FIG. 2A, a gate charge $Q_G$ of the power transistor Qpwr may be calculated based on a configured gate current IG and a time interval T, according to the following Equation 1:

$$Q_G = I_G * T \qquad \text{Equation 1}$$

where, $Q_G$ is the calculated effective gate charge, IG is the configured gate current, and T is a measured time interval from start of the gate drive current (e.g., Ig_drive_ref) to reach a configured gate drive voltage Vg_drive of the gate-source voltage Vgs. Turn ON and turn OFF states of the power transistor Qpwr may be analyzed as processes rather than binary switching events. Power transistor turn ON/OFF processes may include multiple intermediate stages, such that differentiating slew rate control may be applied during each stage to achieve higher efficiency and lower EMI. As set forth herein, to calculate an optimal slew rate at each intermediate stage, the effective gate charge at each intermediate stage may be determined in the calibration phase. Hence, instead of a total gate charge Qg, which may be a value provided in a power transistor datasheet, a gate characteristics curve 202 with calculated gate charge values may be determined to achieve optimal switching. As illustrated by the graph 200, the gate characteristics curve 202 follows the gate-source voltage Vgs. The gate characteristics curve 202 also relates to a drain-source current curve 204 (following a drain-source current Ids) and a drain-source voltage curve 206 (following the drain-source voltage Vds) of the power transistor Qpwr.

According to some embodiments, measurement of the gate characteristics curve 202 may be provided through measurement of signal transition intervals of the drain-source voltage Vds and the gate-source voltage Vgs of the power transistor Qpwr. Because switching may occur very fast, on the order of a few nano seconds (nS), capture of an exact time value of the transition of the drain-source voltage Vds and the gate-source voltage Vgs may provide challenges. As set forth herein, the reference current Ig_drive_ref may be set close to or equal to the minimum gate drive current Ig_drive_min such that switching will take place slowly and transition times may be captured more precisely.

As shown in the graph 200 of FIG. 2A, a total gate charge Qg following the gate characteristics curve 202 of the power transistor Qpwr may be subdivided into multiple stages, as follows.

Qg: A total gate charge to raise the gate-source voltage Vgs of the power transistor Qpwr from an initial reference node voltage Vref (e.g., 0 V) to a configured gate drive voltage Vg_drive (e.g., a high-side drive voltage).

Qgs1 (also known as Qg(th)): A gate charge from the gate-source voltage Vgs of Vref (e.g., 0 V) to a threshold voltage V(th) of the power transistor Qpwr. Current will start to flow from the drain D to the source S of the power transistor Qpwr at the threshold voltage V(th).

Qgs: A gate charge from the gate-source voltage Vgs of Vref (e.g., 0 V) to a plateau voltage (Vplateau), also known as a Miller Plateau, which corresponds to a Plateau Region, as illustrated. At the plateau voltage Vplateau, the drain-source voltage Vds of the power transistor Qpwr will start to slew.

Qgs2: A second gate charge of the power transistor Qpwr equal to Qgs−Qgs1. The second gate charge Qgs2 is provided in a region where the drain-source current Ids of the power transistor Qpwr builds from an initial drain-source current Ids_init (e.g., 0 A) to a configured drain-source operation current Ids_config. The second gate charge Qgs2 is provided in a region commonly known as a dI/dt region.

Qgd: A gate charge when the gate-source voltage Vgs moves through the Plateau Region. In the Plateau Region, the gate-source voltage Vgs of the power transistor Qpwr may remain relatively constant as a reverse transfer capacitance of the gate G of the power transistor Qpwr is charged. The drain-source voltage Vds also slews during the Plateau Region as the power transistor Qpwr becomes enhanced.

Qsw: A gate charge, which is an amount of charge stored as gate capacitance. The gate charge Qsw is provided in a region from when the gate-source voltage Vgs has reached the threshold voltage V(th) until the end of the Plateau Region (Miller Plateau).

Qg(th)+Qsw: A gate charge provided in a region from when the gate-source voltage Vgs begins at Vref (e.g., 0 V) until the end of the Plateau Region (Miller Plateau).

Qod: A gate charge provided for the gate-source voltage Vgs of the power transistor Qpwr to increase from the plateau voltage Vplateau to the configured gate drive voltage Vg_drive. The gate charge Qod enhances a conduction channel of the power transistor Qpwr such that the gate-source voltage Vgs increases to the configured gate drive voltage Vg_drive. By increasing a transition time of the Qod gate charge region, the RdsON value of the power transistor Qpwr may be reduced, thereby increasing system efficiency.

As set forth above, if a relatively low and constant reference current Ig_drive_ref is provided to the power transistor Qpwr in all gate charge stages, transitions of the gate-source voltage Vgs and the drain-source voltage Vds may be monitored and the effective gate charge may be calculated at each stage. The transitions may be monitored with the voltage comparator unit 120 and the time values associated with each stage may be determined with the timer unit 130.

According to some embodiments, a first gate charge region 210 corresponds to the Qgs gate charge, a second gate charge region 212 corresponds to the Qgd gate charge, and a third gate charge region 214 corresponds to the Qod gate charge. The gate charges may be calculated according to the following equations:

$$Qgs = Ig\_drive * T\_VAL1 \qquad \text{Equation 2}$$

$$Qgs + Qgd = Ig\_drive * T\_VAL2 \qquad \text{Equation 3}$$

$$Qgd = (Ig\_drive * T\_VAL2) - Qgs \qquad \text{Equation 4}$$

$$Qg = Ig\_drive * T\_VAL3 \qquad \text{Equation 5}$$

$$Qod = Qg - (Qgs + Qgd) \qquad \text{Equation 6}$$

where, T_VAL1 represents a first time value from initiation of the gate drive current Ig_drive until the gate-source voltage Vgs of the power transistor Qpwr reaches the Plateau Region at the plateau voltage Vplateau, T_VAL2 represents a second time value from initiation of the gate drive current Ig_drive until the gate-source voltage Vgs (and the drain-source voltage Vds) reaches the end of the Plateau Region, and T_VAL3 represents a third time value from initiation of the gate drive current Ig_drive until the gate-source voltage Vgs reaches the configured gate drive voltage Vg_drive.

According to some embodiments, the following operations may be executed for determining gate charge characteristics during the calibration phase of the power transistor Qpwr. The calibration phase may be executed, for example, during a turn ON process for the system 100 including the power transistor Qpwr. The timer unit 130 may start determination of the time values T_VAL1, T_VAL2, T_VAL3 in response to input of the input signal Sig to the first timer input 131, which starts the ON transition of the gate charge Qg. For example, the determination of the time values may initiate on a transition edge (e.g., a rising edge) of the input signal Sig configured as the PWM signal.

The voltage comparator unit 120 may track signal transitions of the drain-source voltage Vds and/or the gate-source voltage Vgs. In some embodiments, set forth in greater detail herein, the voltage comparator unit 120 may include one or more analog comparators. The voltage comparator unit 120 may generate a first comparison signal CS1 when the drain-source voltage Vds falls below a first threshold voltage Vth1. In some embodiments for a single power transistor Qpwr or a high-side power transistor Qpwr in a half-bridge configuration, the first threshold voltage Vth1 may be a programmable threshold voltage provided with reference to a configured supply voltage PVDD, coupled to the drain D of the power transistor Qpwr. For example, the first threshold voltage Vth1 may be input as a percentage value of the configured supply voltage PVDD, such that Vth1=(%)*PVDD. In some embodiments for a low-side power transistor Qpwr in a half-bridge configuration, the first threshold voltage Vth1 may be a programmable threshold voltage provided with reference to a configured switch node voltage Vsw, coupled to the drain D of the low-side power transistor Qpwr. For example, the first threshold voltage Vth1 may be input as a percentage value of the configured switch node voltage Vsw, such that Vth1=(%)*Vsw.

To provide for voltage fluctuations in the system 100 during the turn ON process, as illustrated for the high-side power transistor Qpwr in FIG. 2A, the percentage value of the first threshold voltage Vth1 may vary and may be close to the configured supply voltage PVDD. In some embodiments, the percentage value may be greater than 90% of PVDD, preferably greater than 95% of PVDD, and more preferably greater than 97% of PVDD. For example, in a high-side power transistor Qpwr with a supply voltage PVDD of 20.0 V and the first threshold voltage Vth1 configured as 90% of PVDD, the first threshold voltage Vth1 would be (0.90)*20.0 V=18.0 V. The drain-source voltage Vds crossing the first threshold voltage Vth1 indicates that the drain-source voltage Vds is dropping as the turn ON process of the power transistor Qpwr starts and also indicates the beginning of the Plateau region where the gate-source voltage Vgs reaches the plateau voltage Vplateau. In some embodiments, the first threshold voltage Vth1 may be received from a source external to the gate charge profiler 102, such as an external controller. In some embodiments, the first threshold voltage Vth1 may be output from a voltage divider circuit including a programmable resistor. In an example of the high-side power transistor Qpwr, the programmable resistor may be coupled to the configured supply voltage PVDD, which is coupled to the drain D of the power transistor Qpwr. In an example of the low-side power transistor Qpwr, the programmable resistor may be coupled to a switch node between high-side and low-side power transistors, which is coupled to the drain D of the power transistor Qpwr. Other arrangements and/or configurations for receiving the first threshold voltage are within the scope of the present disclosure.

In some embodiments, a transition edge (e.g., a rising edge) of the first comparison signal CS1 output from the voltage comparator unit 120 may trigger the timer unit 130 to Stop, and the timer unit 130 may produce the first time value T_VAL1 at the timer output 133. The first time value T_VAL1 represents a time interval from Start of driving the power transistor Qpwr with the reference current Ig_drive_ref until the gate-source voltage Vgs of the power transistor Qpwr reaches the Plateau Region at the plateau voltage Vplateau. The gate charge Qgs may then be calculated based on the captured first time value T_VAL1 and the reference current Ig_drive_ref using Equation 2 set forth above. For example, with a reference current Ig_drive_ref of 15 mA and a first time value T_VAL1 of 822 nS, the gate charge Qgs=Ig_drive_ref*T_VAL1=15 mA*822 nS=12.33 nC.

In some embodiments, the voltage comparator unit 120 may generate a second comparison signal CS2 when the drain-source voltage Vds falls below a second threshold voltage Vth2. In some embodiments for a single power transistor Qpwr or a low-side power transistor in a half-bridge configuration the second threshold voltage Vth2 may be a programmable threshold voltage provided with reference to a reference node voltage Vref (e.g., 0 V, GND, etc.), coupled to the source S of the power transistor Qpwr. For example, the second threshold voltage Vth2 may be input as a percentage value of the plateau voltage Vplateau, such that Vth2=(%)*Vplateau. In some embodiments for a high-side power transistor Qpwr in a half-bridge configuration, the second threshold voltage Vth2 may be a programmable threshold voltage provided with reference to the switch node voltage Vsw (e.g., 0 V), coupled to the source S of the power transistor Qpwr. For example, the second threshold voltage Vth2 may be input as a percentage value of the plateau voltage Vplateau, such that Vth2=(%)*Vplateau.

To provide for voltage fluctuations in the system 100 during the turn ON process, the percentage value of the second threshold voltage Vth2 may vary and may be close to and below the plateau voltage Vplateau. In some embodiments, the percentage value may be greater than 90% of Vplateau, preferably greater than 95% of Vplateau, and more preferably greater than 97% of Vplateau. In some embodiments, the plateau voltage Vplateau is a predetermined value that may be provided by a device datasheet for the power transistor Qpwr. For example, in a power transistor Qpwr with a plateau voltage Vplateau of 2.4 V and the second threshold Vth2 configured as 90% of Vplateau, the second threshold Vth2 would be (0.90)*2.4 V=2.16 V and the input to the threshold voltage terminal 106 would be 2.16 V above Vref (for single or low-side power transistors) or 2.16 V above Vsw (for high-side power transistors). The drain-source voltage Vds crossing the second threshold voltage Vth2 indicates that the drain-source voltage Vds is dropping at the end of the Plateau Region and that the gate-source voltage Vgs is rising or transitioning at the end of the Plateau Region. In some embodiments, the second threshold voltage Vth2 may be received from a source external to the gate charge profiler 102, such as an external controller. In some embodiments, the second threshold voltage Vth2 may be output from a voltage divider circuit including a programmable resistor. In an example of a single or a low-side power transistor Qpwr, the programmable resistor may be coupled to the configured reference node voltage Vref (e.g., GND), which is coupled to the source S of the power transistor Qpwr. In an example of a high-side power transistor Qpwr, the programmable resistor may be coupled to the switch node voltage Vsw (e.g., 0 V), which is coupled to the source S of the high-side power transistor. Other arrangements and/or configurations for receiving the first threshold voltage are within the scope of the present disclosure.

In some embodiments, a transition edge (e.g., a rising edge) of the second comparison signal CS2 output from the voltage comparator unit 120 may trigger the timer unit 130 to Stop such that the timer unit 130 produces the second time value T_VAL2 at the timer output 133. The second time value T_VAL2 represents a time interval from start of driving the power transistor Qpwr with the reference current Ig_drive_ref until the gate-source voltage Vgs of the power transistor Qpwr reaches the end of the Plateau Region. The gate charge Qgd may then be calculated based on the captured second time value T_VAL2, the reference current Ig_drive_ref, and the previously calculated gate charge Qgs using Equation 3 and Equation 4 set forth above. For example, with a reference current Ig_drive_ref of 15 mA and a second time value T_VAL2 of 1565 nS, the gate charge Qgd=(Ig_drive_ref*T_VAL2)−Qgs=(15 mA*1565 nS)−12.33 nC=23.475 nC−12.33 nC=11.145 nC.

In some embodiments, the voltage comparator unit 120 may generate a third comparison signal CS3 when the gate-source voltage Vgs rises above a third threshold voltage Vth3 with reference to the configured gate drive voltage Vg_drive. In some embodiments, the third threshold voltage Vth3 may be a programmable threshold voltage provided with reference to the configured gate drive voltage Vg_drive of the power transistor Qpwr. For example, the third threshold voltage Vth3 may be input as a percentage value of the configured gate drive voltage Vg_drive, such that Vth3=(%)*Vg_drive.

To provide for voltage fluctuations in the system 100 during the turn ON process, the third threshold voltage Vth3 may be a percentage value of the configured gate drive voltage Vg_drive. In some embodiments, the percentage value may be greater than 90% of Vg_drive, preferably greater than 95% of Vg_drive, and more preferably greater than 97% of Vg_drive. In some embodiments, the configured gate drive voltage Vg_drive is a predetermined value that may be provided by a configured application and/or a device datasheet for the power transistor Qpwr. For example, in a power transistor Qpwr with a configured gate drive voltage Vg_drive of 10 V and the third threshold Vth3 configured as a percentage of 90% of Vg_drive, the third threshold Vth3 would be (0.90)*10 V=9.0 V. The gate-source voltage Vgs crossing the third threshold voltage Vth3 indicates the end of the turn ON process for the power transistor Qpwr. In some embodiments, the third threshold voltage Vth3 may be received from a source external to the gate charge profiler 102, such as an external controller. In some embodiments, the third threshold voltage Vth3 may be output from a voltage divider circuit including a programmable resistor. Other arrangements and/or configurations for receiving the first threshold voltage are within the scope of the present disclosure.

In some embodiments, a transition edge (e.g., a rising edge) of the third comparison signal CS3 output from the voltage comparator unit 120 may trigger the timer unit 130 to stop such that the timer unit 130 produces the third time value T_VAL3 at the timer output 133. The third time value T_VAL3 represents the time for the gate-source voltage Vgs to ramp up to the target value Vg_drive. The gate charge Qod may then be calculated based on the captured third time value T_VAL3, the reference current Ig_drive_ref, the previously calculated gate charge Qgs, and the previously calculated gate charge Qgd using Equation 5 and Equation 6 set forth above. For example, with a reference current Ig_drive_ref of 15 mA and a third time value T_VAL3 of 4215 nS, the gate charge Qod=Qg−(Qgs+Qgd)= (Ig_drive_ref*T_VAL3)−(Qgs+Qgd)=(15 mA*4215 nS)−(12.3 nC+11.145 nC)=63.22 nC−23.44 nC=39.78 nC.

In some embodiments, a propagation delay PD of the gate driver 140 may precede determination of the time values set forth above. The propagation delay PD corresponds to a time for the gate driver 140 to produce the gate drive signal Ig_drive and/or the reference current Ig_drive_ref in response to the input signal Sig. In some embodiments, the propagation delay PD may be subtracted from each of the time values T_VAL1, T_VAL2, T_VAL3 before calculation of the gate charges Qgs, Qgd, Qod. In some embodiments, subtraction of the propagation delay PD from the time values may provide a more accurate determination of the gate charges Qgs, Qgd, Qod. As set forth above, the graph 200 illustrates gate charge characteristics of a power transistor during a turn ON process. Similar gate charge characteristics of a power transistor configured as a low-side power transistor in a half-bridge configuration during a turn ON and turn OFF process are also set forth in greater detail below with reference to FIG. 7. Other arrangements and configurations for determining the time values T_VAL1, T_VAL2, T_VAL3, and the gate charges Qgs, Qgd, Qod are within the scope of the present disclosure.

In the example of FIG. 2B, a graph 220 illustrates gate charge characteristics of a power transistor, such as the power transistor Qpwr, in a power electronics system during a turn OFF process. The effective gate charge may be measured by running a gate charge calibration phase before or during startup of the system 100. During the calibration phase, the power transistor Qpwr may be turned OFF after application of a relatively low and constant reference current Ig_drive_ref. The gate charge QG of the power transistor Qpwr may be calculated based on a configured gate current IG and a time interval T, according to Equation 1 set forth above. As illustrated by the graph 220, a gate characteristics curve 222 follows the gate-source voltage Vgs. The gate characteristics curve 222 also relates to a drain-source current curve 224 (following a drain-source current Ids) and a drain-source voltage curve 226 (following a drain-source voltage Vds) of the power transistor Qpwr. In some embodiments, the gate charge characteristics are different during the turn OFF process from the turn ON process.

As shown in the graph 220 of FIG. 2B, a total gate charge Q2g following the gate characteristics curve 222 of the power transistor Qpwr may be subdivided into multiple stages, as follows.

Q2g: A total gate charge to lower the gate-source voltage Vgs of the power transistor Qpwr from the configured gate drive voltage Vg_drive to the reference node voltage Vref (e.g., 0 V).

Q2od: A gate charge for the gate-source voltage Vgs of the power transistor Qpwr to decrease from the configured gate drive voltage Vg_drive to the plateau voltage Vplateau. The gate charge Q2od reduces the conduction channel of the power transistor Qpwr such that the gate-source voltage Vgs decreases to the plateau voltage Vplateau. By increasing a transition time of the Qod gate charge region, a RdsOFF value of the power transistor Qpwr may be reduced, thereby increasing system efficiency.

Q2gd: A gate charge when the gate-source voltage Vgs moves through the Plateau Region. In the Plateau Region, the gate-source voltage Vgs of the power transistor Qpwr may remain relatively constant as a reverse transfer capacitance of the gate G of the power transistor Qpwr is discharged. The drain-source voltage Vds also slews during the Plateau Region as the power transistor Qpwr discharges.

Q2sw: A gate charge, which is an amount of charge stored as gate capacitance. The gate charge Q2sw is provided in a region from when the gate-source voltage Vgs reaches the beginning of the Plateau Region (Miller Plateau) until the gate-source voltage Vgs reaches the threshold voltage Vth.

Q2gs: A gate charge from the end of Plateau Region at the plateau voltage Vplateau to when the gate-source voltage Vgs discharges to reach Vref (e.g., 0 V).

Q2gs1 (also known as Q2g(th)): A gate charge from the gate-source voltage Vgs discharges from the threshold voltage V(th) to the reference node voltage Vref (e.g., 0 V).

As set forth above, if a relatively low and constant reference current Ig_drive_ref is first provided to the power transistor Qpwr and then stopped, transitions of the gate-source voltage Vgs and the drain-source voltage Vds may be monitored and the effective gate charge may be calculated at each stage. The transitions may be monitored with the voltage comparator unit 120 and the time values associated with each stage may be determined with the timer unit 130.

According to some embodiments, a fourth gate charge region 230 corresponds to the Q2od gate charge, a fifth gate charge region 232 corresponds to the Q2gd gate charge, and a sixth gate charge region 234 corresponds to the Q2gs gate charge. The gate charges may be calculated according to the following equations:

$$Q2od = Ig\_drive * T\_VAL4 \quad \text{Equation 7}$$

$$Q2od + Q2gd = Ig\_drive * T\_VAL5 \quad \text{Equation 8}$$

$$Q2gd = (Ig\_drive * T\_VAL5) - Q2od \quad \text{Equation 9}$$

$$Q2g = Ig\_drive * T\_VAL6 \quad \text{Equation 10}$$

$$Q2gs = Q2g - (Q2od + Q2gd) \quad \text{Equation 11}$$

where, T_VAL4 represents a fourth time value from stopping of the gate drive current Ig_drive until the gate-source voltage Vgs of the power transistor Qpwr reaches the Plateau Region at the plateau voltage Vplateau, T_VAL5 represents a fifth time value from stopping of the gate drive current Ig_drive until the gate-source voltage Vgs (and the drain-source voltage Vds) reaches the end of the Plateau Region, and T_VAL6 represents a sixth time value from stopping of the gate drive current Ig_drive until the gate-source voltage Vgs reaches ground GND.

According to some embodiments, the following operations may be executed for determining gate charge characteristics during the calibration phase of the power transistor Qpwr. The calibration phase may be executed, for example, during a turn OFF process for the system 100 including the power transistor Qpwr when the input signal Sig transitions from an ON state to an OFF state to control the gate drive current Ig_drive to stop driving the gate G of the power transistor Qpwr and turn the power transistor OFF. The timer unit 130 may start determination of the time values T_VAL4, T_VAL5, T_VAL6 in response to transition of the input signal Sig to the first timer input 131, which starts the OFF transition of the gate charge Qg.

The voltage comparator unit 120 may track signal transitions of the drain-source voltage Vds and/or the gate-source voltage Vgs. The voltage comparator unit 120 may generate a fourth comparison signal CS4 when the gate-source voltage Vgs falls below a fourth threshold voltage Vth4. In some embodiments, the first threshold voltage Vth4 may be a programmable threshold voltage provided with reference to a configured gate drive voltage Vg_drive, coupled to the gate G of the power transistor Qpwr. For example, the fourth threshold voltage Vth4 may be input as a percentage value of the configured gate drive voltage Vg_drive, such that Vth4=(%)*Vg_drive. In some embodiments, the fourth comparison signal CS4 output from the voltage comparator unit 120 may trigger the timer unit 130 to Stop, and the timer unit 130 may produce the fourth time value T_VAL4 at the timer output 133. The fourth time value T_VAL4 represents a time interval from stopping of driving the power transistor Qpwr with the reference current Ig_drive_ref until the gate-source voltage Vgs of the power transistor Qpwr reaches the Plateau Region at the plateau voltage Vplateau. The gate charge Q2od may then be calculated based on the captured fourth time value T_VAL4 and the reference current Ig_drive_ref using Equation 7 set forth above.

In some embodiments, the voltage comparator unit 120 may generate a fifth comparison signal CS5 when the drain-source voltage Vds rises above a fifth threshold voltage Vth5. In some embodiments, the fifth threshold voltage Vth5 may be a programmable threshold voltage provided with reference to the configured supply voltage PVDD, coupled to the drain D of the power transistor Qpwr. For example, the fifth threshold voltage Vth5 may be input as a percentage value of the configured supply voltage PVDD such that Vth5=(%)*PVDD. The drain-source voltage Vds crossing the fifth threshold voltage Vth5 indicates that the drain-source voltage Vds is rising or transitioning at the end of the Plateau Region and that the gate-source voltage Vgs has reached the end of the Plateau Region. In some embodiments, the fifth comparison signal CS5 output from the voltage comparator unit 120 may trigger the timer unit 130 to Stop such that the timer unit 130 produces the fifth time value T_VAL5 at the timer output 133. The fifth time value T_VAL5 represents a time interval from stopping of driving the power transistor Qpwr with the reference current Ig_drive_ref until the gate-source voltage Vgs reaches the end of the Plateau Region. The gate charge Q2gd may then be calculated based on the captured fifth time value T_VAL5, the reference current Ig_drive_ref, and the previously calculated gate charge Q2od using Equation 8 and Equation 9 set forth above.

In some embodiments, the voltage comparator unit 120 may generate a sixth comparison signal CS6 when the gate-source voltage Vgs falls below a sixth threshold voltage Vth6 with reference to ground GND. In some embodiments, the sixth threshold voltage Vth6 may be a programmable threshold voltage provided with reference to ground GND coupled to the source S of the power transistor Qpwr. For example, the sixth threshold voltage Vth6 may be input as a predetermined value above ground. In another example, the sixth threshold voltage Vth6 may be input as a percentage value of the plateau voltage Vplateau, such that Vth6=(%)*Vplateau. The gate-source voltage Vgs crossing the sixth threshold voltage Vth6 indicates the end of the turn OFF process for the power transistor Qpwr. In some embodiments, the sixth comparison signal CS6 output from the voltage comparator unit 120 may trigger the timer unit 130 to stop such that the timer unit 130 produces the sixth time value T_VAL6 at the timer output 133. The sixth time value T_VAL6 represents the time for the gate-source voltage Vgs to decrease to ground GND. The gate charge Q2gs may then be calculated based on the captured third time value T_VAL6, the reference current Ig_drive_ref, the previously calculated gate charge Q2od, and the previously calculated gate charge Q2gd using Equation 10 and Equation 11 set forth above.

In some embodiments, a propagation delay PD of the gate driver 140 may precede determination of the time values set forth above. The propagation delay PD corresponds to a time for the gate driver 140 to stop producing the gate drive signal Ig_drive and/or the reference current Ig_drive_ref in response to the input signal Sig. In some embodiments, the propagation delay PD may be subtracted from each of the time values T_VAL4, T_VAL5, T_VAL6 before calculation of the gate charges Q2od, Q2gd, Q2gs. In some embodiments, subtraction of the propagation delay PD from the time values may provide a more accurate determination of the gate charges Q2od, Q2gd, Q2gs.

As set forth above, the graph 220 illustrates gate charge characteristics of a power transistor during a turn OFF process. Similar gate charge characteristics of a power transistor configured as a low-side power transistor in a half-bridge configuration during a turn ON and turn OFF process are also set forth in greater detail below with reference to FIG. 7. Other arrangements and configurations for determining the time values T_VAL4, T_VAL5, T_VAL6, and the gate charges Q2od, Q2gd, Q2gs are within the scope of the present disclosure.

Figure 3:
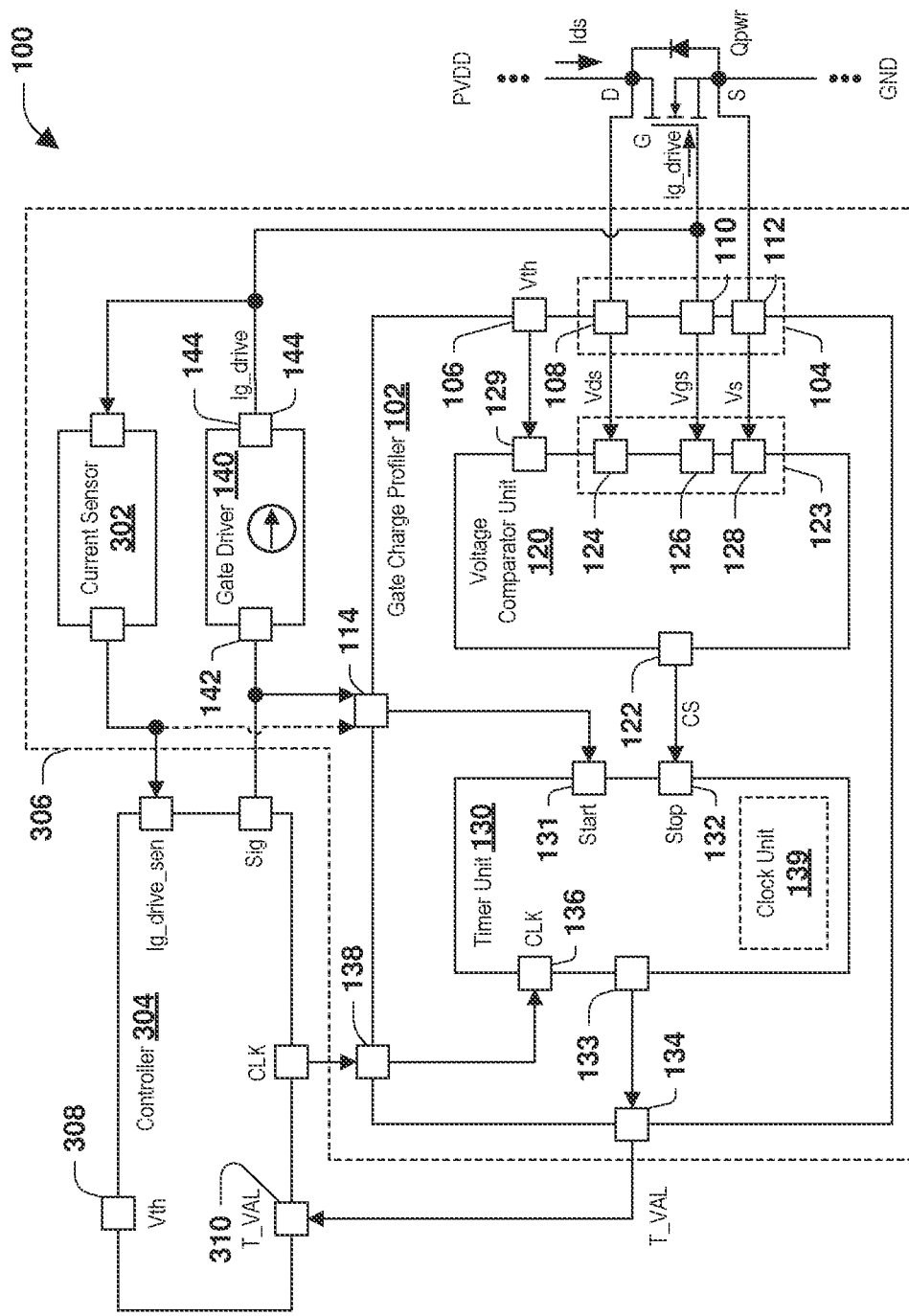
FIG. 3 illustrates a system including a gate charge profiler and a power transistor, according to some embodiments.

FIG. 3 illustrates a system including a gate charge profiler and a power transistor, according to some embodiments. In the example of FIG. 3, the system 100 includes the gate charge profiler 102, the gate driver 140, a current sensor 302, and a controller 304. In some embodiments, at least one of the gate charge profiler 102, the gate driver 140, or the current sensor 302 are integral or included in a single component, such as a gate driver IC 306. In some embodiments, the controller 304 is included in the gate driver IC 306. In some embodiments, the controller 304 is separate from the gate driver IC 306, for example in a separate MCU.

In some embodiments, the current sensor 302 may be configured to sense the gate drive current Ig_drive output from the gate driver 140 and output a gate drive sensing signal Ig_drive_sen to the controller 304. In some embodiments, the gate drive sensing signal Ig_drive_sen may include current value information of the gate drive current Ig_drive. In some embodiments, the current sensor 302 may output the gate drive sensing signal Ig_drive_sen to the current input terminal 114 of the gate charge profiler 102. In such embodiments, the gate drive sensing signal Ig_drive_sen may be received at the current input terminal 114 as a trigger that includes the propagation delay PD of the gate drive current Ig_drive produced by the gate driver 140. For example, output of the gate drive sensing signal Ig_drive_sen by the current sensor 302 may include a propagation delay on the order of single digit nano seconds (nS), while the gate driver 140 may include a propagation delay over 100 nS or greater. In this example, the propagation delay of the current sensor 302 may be small compared to the changes in the drain-source voltage Vds, the gate-source Voltage Vgs, and the drain-source current Ids, and the gate charges Qgs, Qgd, Qod may be calculated without subtraction of the propagation delay PD from the time values T_VAL1, T_VAL2, T_VAL3.

In some embodiments, the propagation delay PD of the gate driver 140 may be subtracted from the time values T_VAL1, T_VAL2, T_VAL3 before calculation of the gate charges Qgs, Qgd, Qod. For example as part of the calibration phase, the controller 304 may capture an initial time value T_VAL_init upon output of the input signal Sig, capture a propagation delay time value T_VAL_pd upon receipt of the gate drive sensing signal Ig_drive_sen output from the current sensor 302, and then determine the propagation delay PD as a difference of the initial time value T_VAL_init and the propagation delay time value T_VAL_pd. The propagation delay PD may then be stored by the controller 304 and subtracted from the time values T_VAL1, T_VAL2, T_VAL3 before calculation of the gate charges Qgs, Qgd, Qod. In some examples, calculation of the gate driver propagation delay PD from receipt of the gate drive value Ig_drive_VAL may provide more accurate measurement than a device datasheet of the gate driver 140, and may incorporate delays associated with PCB layout, interaction with other circuit elements, etc.

In some embodiments, the controller 304 includes a controller threshold terminal 308 to output the threshold voltage Vth to the threshold voltage terminal 106 of the gate charge profiler 102. In some embodiments and to perform the calibration phase of the power transistor Qpwr, the controller 304 may output the input signal Sig that controls the gate drive current Ig_drive to the current input terminal 114 and the gate driver input 142. The controller 304 may output the threshold voltages Vth1, Vth2, Vth3 to the threshold voltage terminal 106 and receive the time values T_VAL1, T_VAL2, T_VAL3 output from the time value output terminal 134 in response to the gate drive current Ig_drive, as set forth above. The controller may calculate the gate charges Qgs, Qgd, Qod based on the gate drive current Ig_drive and the time values T_VAL1, T_VAL2, T_VAL3 according to Equations 2-6 as set forth above.

In some embodiments, upon completion of the calibration phase, the controller 304 may output a second input signal Sig2 that controls a second gate drive current Ig_drive2 input to the gate G of the power transistor Qpwr during a time interval, wherein at least one of the second input signal Sig2 or the time interval is based on the gate charge Qgs. In some embodiments, the controller 304 may output the clock signal CLK to the clock input terminal 138. In some embodiments, the clock signal CLK may be generated within the timer unit 130 by the clock unit 139. Other arrangements and configurations of the gate charge profiler 102, the gate driver 140, the current sensor 302, and the controller 304 are within the scope of the present disclosure.

Figure 4:
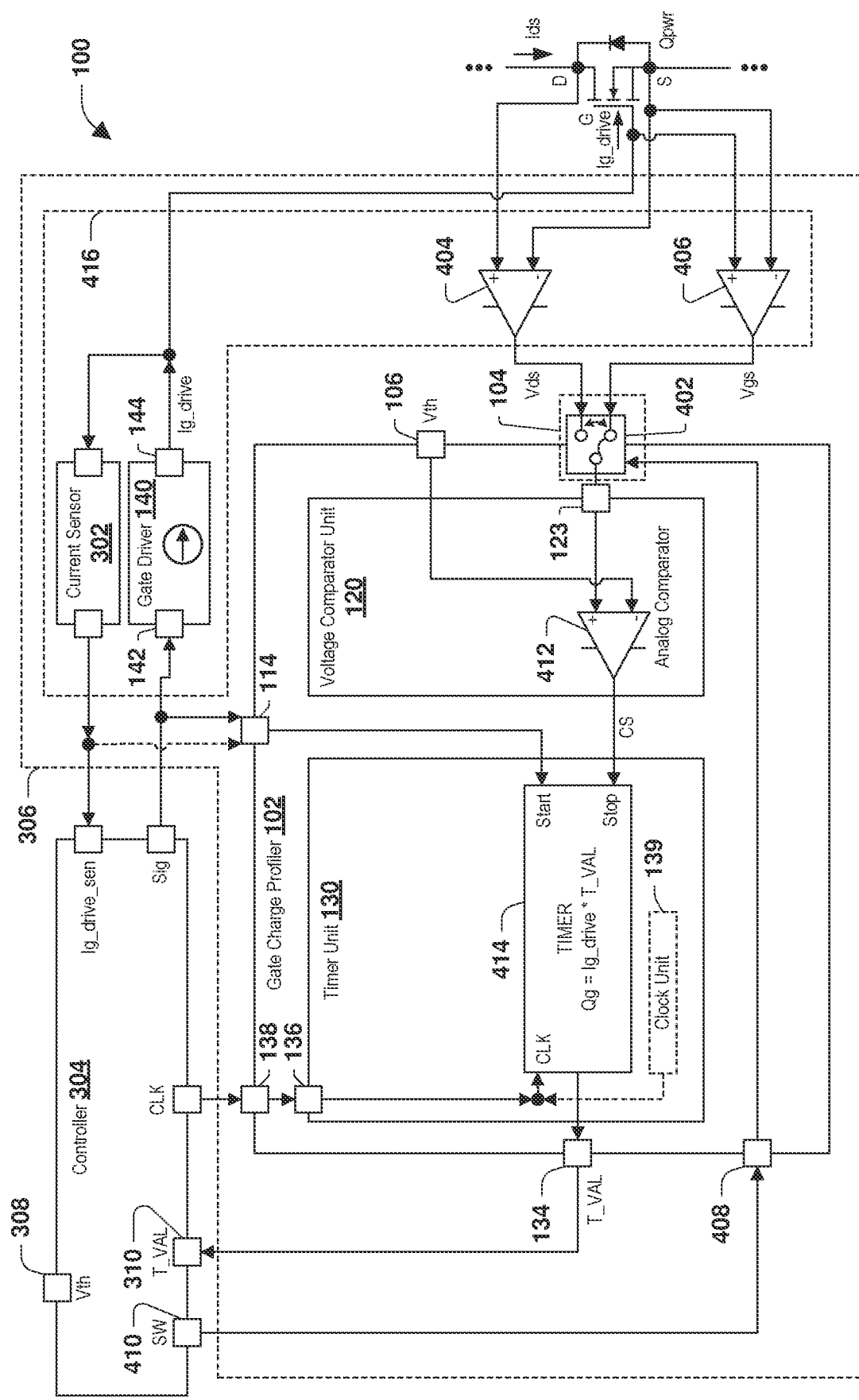
FIG. 4 illustrates a system including a gate charge profiler and a power transistor, according to some embodiments.

FIG. 4 illustrates a system including a gate charge profiler and a power transistor, according to some embodiments. In the example of FIG. 4, the gate charge profiler 102 includes the comparator input terminal 104 configured as a switch 402 to selectively receive the drain-source voltage Vds and the gate-source voltage Vgs. For example, the switch 402 may be a tri-state switch that is coupled to receive the drain-source voltage Vds, the gate-source voltage Vgs, or maintain a high impedance state to effectively remove the comparator input terminal 104 from the gate charge profiler 102. In some embodiments, the switch 402 selectively receives the drain-source voltage Vds from a first voltage comparator 404 coupled across the drain D and the source S of the power transistor Qpwr and the gate-source voltage Vgs from a second voltage comparator 406 coupled across the gate G and the source S of the power transistor Qpwr. The gate charge profiler 102 may include a switch terminal 408, coupled to a switch output 410 of the controller 304, to receive a switch signal SW to control operation of the switch 402. In some embodiments, the first and second voltage comparators (i.e., 404, 406) are included in the gate charge profiler 102. The switch 402 may perform a switching function between a first pair of inputs coupled to the drain D and the source S of the power transistor Qpwr and a second pair of inputs coupled to the gate G and the source S of the power transistor Qpwr. The outputs of the first and second voltage comparators (i.e., 404, 406) are coupled to the first comparator input 123 by the switch 402. In some embodiments, the first and second voltage comparators (i.e., 404, 406), the gate charge profiler 102, the current sensor 302, and the gate driver 140 are included in the gate driver IC 306. In some embodiments, the first and second voltage comparators (i.e., 404, 406), the current sensor 302, and the gate driver 140 are included in a gate driver IC 416 and the gate charge profiler 102 is a separate circuit from the gate driver IC 416. Other arrangements and configurations to switch the drain-source voltage Vds and the gate-source voltage Vgs to the first comparator input 123 are within the scope of the present disclosure.

In some embodiments, the voltage comparator unit 120 includes an analog comparator 412, coupled to the threshold voltage terminal 106 and the switch 402, and configured to generate the comparison signal CS based on a comparison of the input voltage and the threshold voltage. In some embodiments, the timer unit 130 includes a timer 414 having a first input coupled to an output of the analog comparator 412 and a second input coupled to the current input terminal 114, configured to determine the time value T_VAL based on input of the comparison signal CS and input of the input signal Sig.

In some embodiments, the analog comparator 412 may output the first comparison signal CS1 when the first threshold voltage Vth1 equals the drain-source voltage Vds. The timer 414 may Start determination of the first time value T_VAL1 in response to input of the input signal Sig and Stop determination of the first time value T_VAL1 upon receipt of the first comparison signal CS1. The analog comparator 412 may output the second comparison signal CS2 when the second threshold voltage Vth2 equals the drain-source voltage Vds. The timer 414 may Start determination of the second time value T_VAL2 in response to input of the input signal Sig and Stop determination of the second time value T_VAL2 upon receipt of the second comparison signal CS2. The analog comparator 412 may output the third comparison signal CS3 when the third threshold voltage Vth3 equals the gate-source voltage Vgs. The timer 414 may Start determination of the third time value T_VAL3 in response to input of the input signal Sig and Stop determination of the third time value T_VAL3 in response to input of the third comparison signal CS3.

In some embodiments, the timer 414 includes registers to store and output the time values T_VAL1, T_VAL2, T_VAL3. In some embodiments, the third time value T_VAL3 may be substantially greater than the second time value T_VAL2, such as over twice as long, to permit a time margin for operation of the switch 402. For example, if the second time value T_VAL2 is on the order of 1565 nS, the switch signal SW from the switch output 410 of the controller 304 may be output 2000 nS after output of the input signal Sig, such that the switch 402 has completed switching to receive the gate-source voltage Vgs. The controller 304 may then receive the time values T_VAL1, T_VAL2, T_VAL3 output from the timer 414 and calculate the gate charges Qgs, Qgd, Qod, as set forth herein. Other arrangements and configurations of the switch 402, the analog comparator 412, and the timer 414 are within the scope of the present disclosure.

Figure 5:
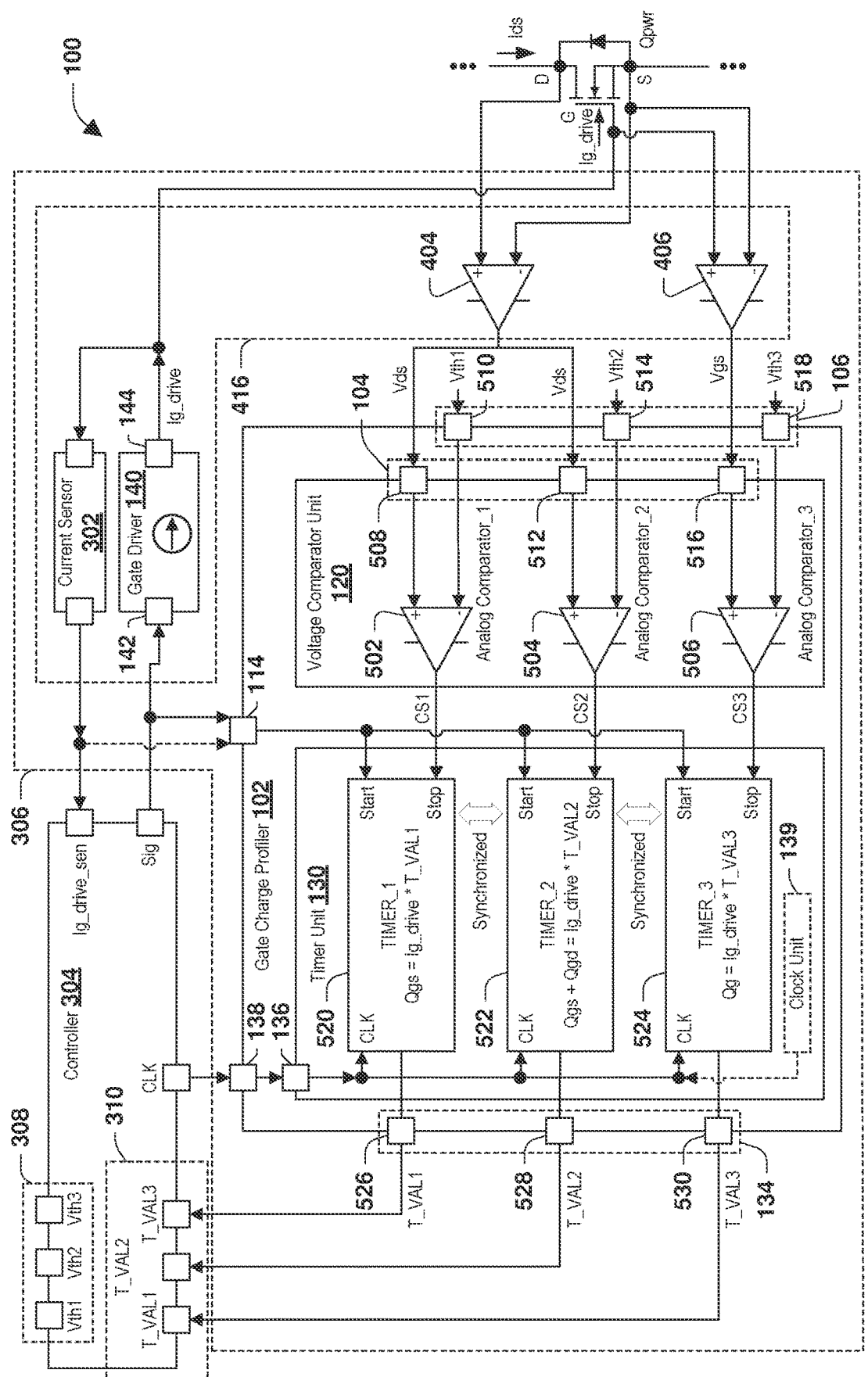
FIG. 5 illustrates a system including a gate charge profiler and a power transistor, according to some embodiments.

FIG. 5 illustrates a system including a gate charge profiler and a power transistor, according to some embodiments. In the example of FIG. 5, the voltage comparator unit 120 includes a first analog comparator 502, a second analog comparator 504, and a third analog comparator 506. The first analog comparator 502 is coupled to a first comparator input 508 of the comparator input terminal 104 to receive the drain-source voltage Vds and is coupled to a first threshold input 510 of the threshold voltage terminal 106 to receive the first threshold voltage Vth1. The second analog comparator 504 is coupled to a second comparator input 512 of the comparator input terminal 104 to receive the drain-source voltage Vds and is coupled to a second threshold input 514 of the threshold voltage terminal 106 to receive the second threshold voltage Vth2. The third analog comparator 506 is coupled to a third comparator input 516 of the comparator input terminal 104 to receive the gate-source voltage Vgs and is coupled to a third threshold input 518 of the threshold voltage terminal 106 to receive the third threshold voltage Vth3.

In some embodiments, the threshold inputs (i.e., 510, 514, 518) are terminals coupled to the controller threshold terminal 308 of the controller 304 to receive the threshold voltages Vth1, Vth2, Vth3. In some embodiments, the threshold inputs (i.e., 510, 514, 518) are programmable registers configured to respectively store and output the threshold voltages Vth1, Vth2, Vth3. The programmable thresholds may be input to the programmable registers from a source external to the gate charge profiler 102, such as from the controller 304 or from one or more programmable resistors responsive to outputs from the controller threshold terminal 308. Other arrangements and/or configurations for inputting the threshold voltages Vth1, Vth2, Vth3 to the gate charge profiler 102 are within the scope of the present disclosure.

In some embodiments, the timer unit 130 includes a first timer 520, a second timer 522, and a third timer 524. The first timer 520 may Start determination of the first time value T_VAL1 based on input of the input signal Sig from the current input terminal 114 and Stop determination of the first time value T_VAL1 based on input of the first comparison signal CS1 from the first analog comparator 502. The first timer 520 may then output the first time value T_VAL1 at a first time value output 526 of the time value output terminal 134. The second timer 522 may Start determination of the second time value T_VAL2 based on input of the input signal Sig from the current input terminal 114 and Stop determination of the second time value T_VAL2 based on input of the second comparison signal CS2 from the second analog comparator 504. The second timer 522 may then output the second time value T_VAL2 at a second time value output 528 of the time value output terminal 134. The third timer 524 may Start determination of the third time value T_VAL3 based on input of the input signal Sig from the current input terminal 114 and Stop determination of the third time value T_VAL3 based on input of the third comparison signal CS3 from the third analog comparator 506. The third timer 524 may then output the third time value T_VAL3 at a third time value output 530 of the time value output terminal 134. In some embodiments as set forth above, the input signal Sig is a PWM signal, and the timers (i.e., 520, 522, 524) may Start determination of the time values T_VAL1, T_VAL2, T_VAL3 based on a transition edge of the PWM signal and Stop determination of the time values based on a transition edge of the comparison signals CS1, CS2, CS3.

In some embodiments, the timers (i.e., 520, 522, 524) may receive the clock signal CLK as an external clock signal from the clock input 136 coupled to the clock input terminal 138 of the gate charge profiler 102. In some embodiments, the timers may receive the clock signal CLK as an internal clock signal from the clock unit 139, which may be internal to the gate charge profiler 102 and/or the timer unit 130. The timers may be synchronized such that each timer initiates determination of a corresponding time value at the same clock period and each clock cycle rises and falls at the same time.

In some embodiments, the time value outputs (i.e., 526, 528, 530) are terminals coupled to the time value input terminal 310 of the controller 304 to output the time values T_VAL1, T_VAL2, T_VAL3. In some embodiments, the time value outputs (i.e., 526, 528, 530) are registers configured to respectively store and output the time values. The time values may be output from the registers to a destination external to the gate charge profiler 102, such as to the time value input terminal 310 of the controller 304, which may include registers to store the time values. Other arrangements and/or configurations for determining the time values T_VAL1, T_VAL2, T_VAL3 from the input signal Sig, the threshold voltages Vth1, Vth2, Vth3, and the voltages Vds, Vgs of the power transistor Qpwr are within the scope of the present disclosure.

Figure 6A:
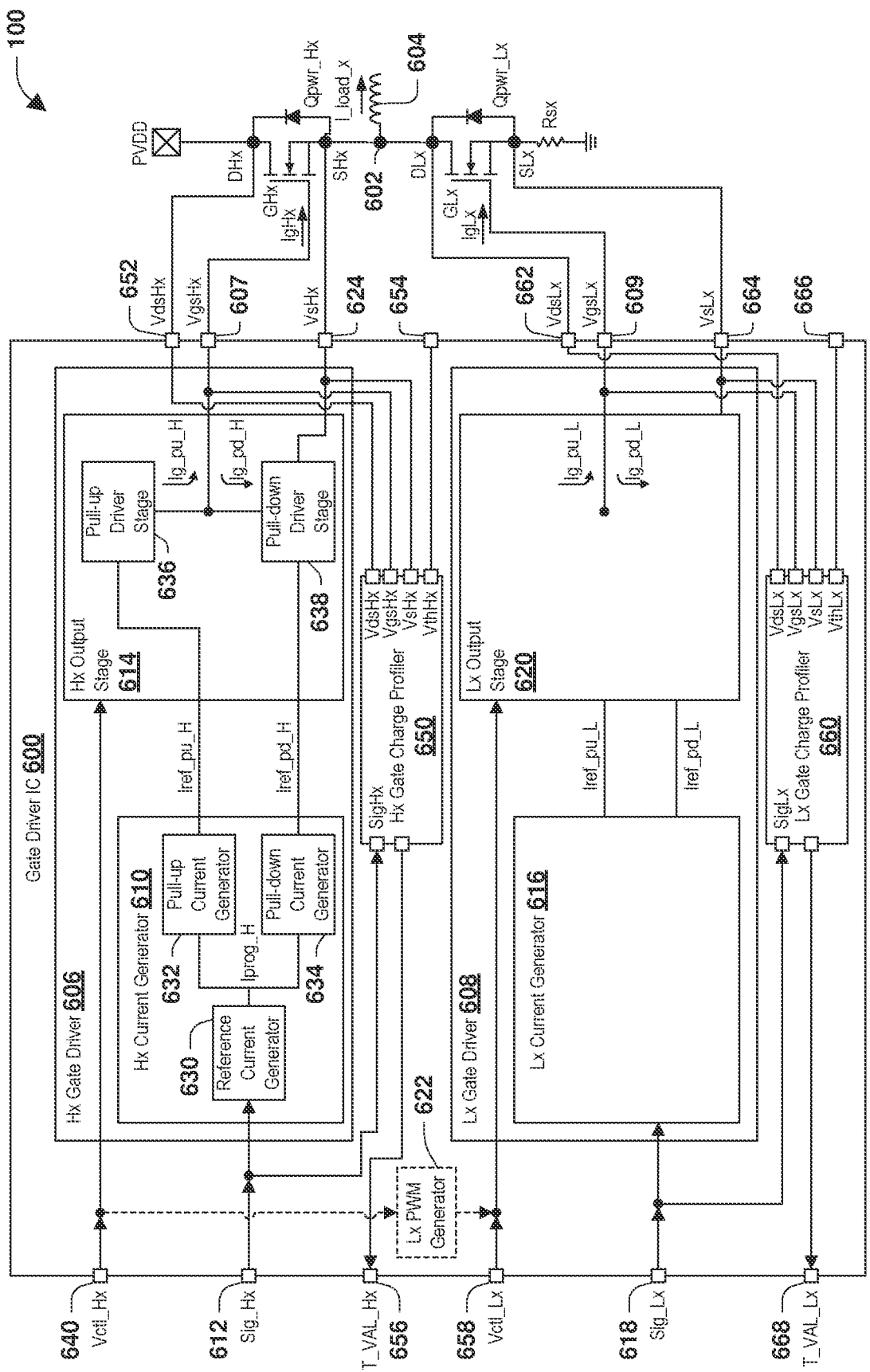
FIGS. 6A-6C illustrate a system including a gate driver IC and power transistors in a half-bridge configuration, according to some embodiments.
Figure 6B:
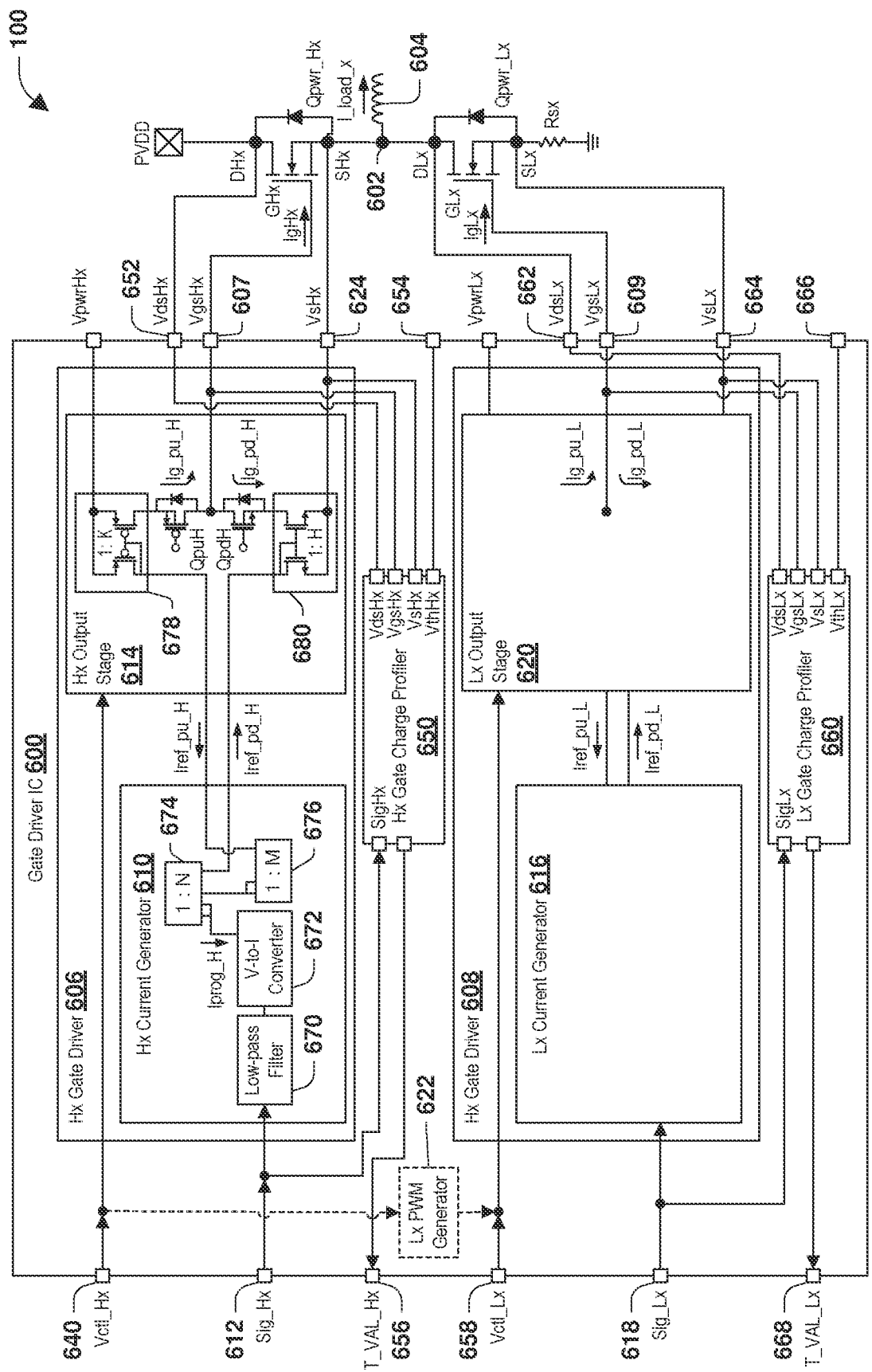
Figure 6C:
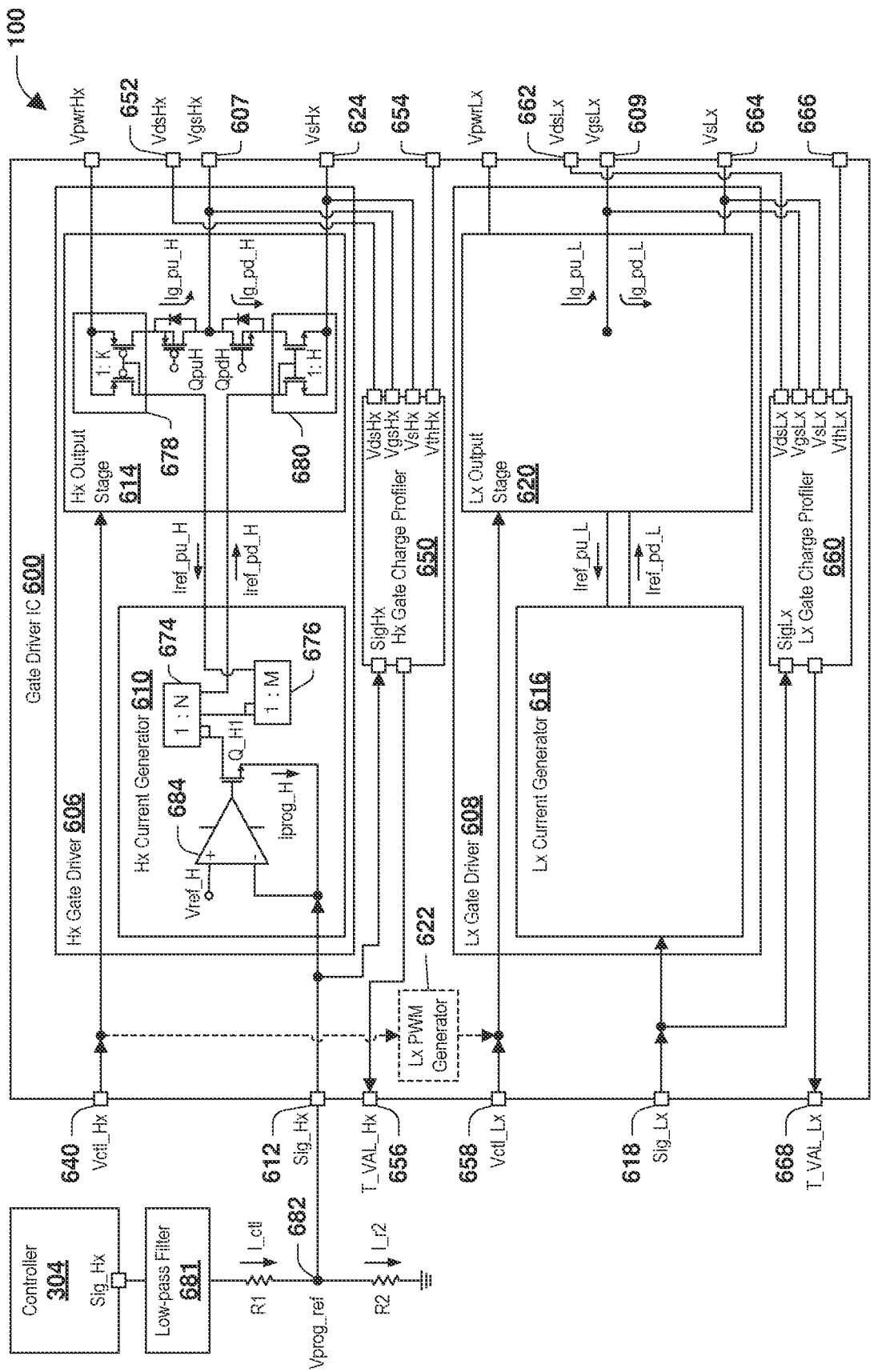

FIGS. 6A-6C illustrate a system including a gate driver IC and power transistors in a half-bridge configuration, according to some embodiments. In the example of FIG. 6A, the system 100 includes a gate driver IC 600 configured to drive a high-side power transistor Qpwr_Hx and a low-side power transistor Qpwr_Lx coupled at a switch node 602 to form a half-bridge between a supply voltage PVDD and ground. The switch node 602 is coupled to and supplies a load current I_load_x to a load 604. As set forth herein with reference to elements of the system 100, the designation "H" indicates high-side, the designation "L" indicates low-side, and the designation "x" indicates that an element may be repeated for a number of similarly configured elements. For example, an SMPS may include four power transistors (e.g., two high-side power transistors Qpwr_H1, Qpwr_H2, and two low-side power transistors Qpwr_L1, Qpwr_L2), and a three phase inverter to drive a BLDC may include six power transistors (e.g., three high-side power transistors Qpwr_H1, Qpwr_H2, Qpwr_H3, and three low-side power transistors Qpwr_L1, Qpwr_L2, Qpwr_L3). Other arrangements and/or configurations of repeating elements in power electronics systems are within the scope of the present disclosure.

In some embodiments, the gate driver IC 600 may include a high-side gate driver 606 and a low-side gate driver 608. The high-side gate driver 606 may be configured to output a gate drive current IgHx at an output gate terminal 607 coupled to a gate GHx of the high-side power transistor Qpwr_Hx in response to an input signal Sig_Hx (e.g., a PWM signal). The high-side gate driver 606 may include a current generator 610 to receive a voltage or current level indicated by the input signal Sig_Hx applied to a high-side input terminal 612. In some embodiments, the input signal Sig_Hx may be received from a source external to the gate driver IC 600, such as the controller 304, a programmable resistor, and/or another signal source. The high-side gate driver 606 may include an output stage 614 to output the gate drive current IgHx at the output gate terminal 607.

The low-side gate driver 608 may be configured to output a gate drive current IgLx at an output gate terminal 609 coupled to a gate GLx of the low-side power transistor Qpwr_Lx in response to an input signal Sig_Lx (e.g., a PWM signal). The low-side gate driver 608 may include a current generator 616 to receive a voltage or current level indicated by the input signal Sig_Lx applied to a low-side input terminal 618. In some embodiments, the input signal Sig_Lx may be received from a source external to the gate driver IC 600, such as the controller 304, a programmable resistor, and/or another signal source. The low-side gate driver 608 may include an output stage 620 to output the gate drive current IgLx at the output gate terminal 609. Other arrangements and/or configurations of the current generator 616 and the output stage 620 of the low-side gate driver 608 are within the scope of the present disclosure.

In some embodiments, the current generator 616 and the output stage 620 of the low-side gate driver 608 may be configured similar to the current generator 610 and the output stage 614 of the high-side gate driver 606. The following detailed description is provided with reference to the high-side gate driver 606. In some embodiments, the current generator 610 may include a reference current generator 630, which generates a reference current Iprog_H that follows a voltage or current level of the input signal Sig_Hx input at the high-side input terminal 612. The reference current Iprog_H may be provided to a pull-up current generator 632 and a pull-down current generator 634 which may output, respectively, a pull-up reference current Iref_pu_H and a pull-down reference current Iref_pd_H. The pull-up and pull-down reference currents Iref_pu_H, Iref_pd_H may be based upon the reference current Iprog_H. For example, the current levels of the pull-up and pull-down reference currents Iref_pu_H, Iref_pd_H may be determined by multiplying the reference current Iprog_H by pull-up and pull-down factors.

The output stage 614 of the high-side gate driver 606 may include a pull-up driver stage 636 and a pull-down driver stage 638, each of which is connected to the output gate terminal 607. The pull-up driver stage 636 may provide a source current Ig_pu_H based upon the pull-up reference current Iref_pu_H, which is based upon the reference current Iprog_H. The pull-down driver stage 638 may provide a sink current Ig_pd_H based upon the pull-down reference current Iref_pd_H, which is based upon the reference current Iprog_H.

In some embodiments, a switch control signal Vctl_Hx, provided at a switch control terminal 640, may switch the output stage 614 by determining which of the pull-up driver stage 636 and the pull-down driver stage 638 are activated. For example in an SMPS, the switch control signal Vctl_Hx may be a PWM signal used for controlling the power output of the SMPS. A high voltage level, e.g., 5 V, at the switch control terminal 640 may enable the pull-up driver stage 363, such that the source current Ig_pu_H is provided, via the output gate terminal 607, to the gate GHx of the high-side power transistor Qpwr_Hx. The source current Ig_pu_H may charge a gate capacitance of the high-side power transistor Qpwr_Hx and raise a gate voltage VgsHx, thereby turning ON the high-side power transistor Qpwr_Hx. Conversely, a low voltage level, e.g., 0 V, at the switch control terminal 640 may enable the pull-down driver stage 638, such that the sink current Ig_pd_H is sunk, via the output gate terminal 607, from the gate GHx. The sink current Ig_pd_H may discharge the gate capacitance of the high-side power transistor Qpwr_Hx, thereby lowering the gate voltage VgsHx and turning OFF the high-side power transistor Qpwr_Hx. As illustrated, the pull-down current Ig_pd_H may be sunk from the output gate terminal 607 to an output source terminal 624, which is coupled to a source terminal SHx of the high-side power transistor Qpwr_Hx and has a voltage VsHx. In some embodiments, only one of the driver stages (i.e., 636, 638) is enabled at once, and the output stage 614 may include circuitry to insert a dead-time interval at each transition of the switch control signal Vctl_Hx so as to ensure that the driver stages (i.e., 636, 638) are not enabled simultaneously.

As set forth above, the high-side gate driver 606 may source the current Ig_pu_H to the output gate terminal 607, or sink the current Ig_pd_H from the output gate terminal 607, to turn the high-side power transistor Qpwr_Hx ON or OFF. As set forth in greater detail herein, the source and sink currents Ig_pu_H, Ig_pd_H need not be the same. While both the source and sink currents Ig_pu_H, Ig_pd_H in FIG. 6A may be based upon a voltage or current level of the input signal Sig_Hx at the high-side input terminal 612, other arrangements and/or configurations are within the scope of the present disclosure. For example, the input signal Sig_Hx may be a PWM signal that provides a voltage or current level to the current generator 610 for setting the source and sink currents Ig_pu_H, Ig_pd_H. Other example implementations could include separate analog input terminals for setting the source and sink currents Ig_pu_H, Ig_pd_H with separate input signals, which may be PWM signals.

In some embodiments, the gate driver IC 600 may include a gate charge profiler 650 to determine gate charge characteristics of the high-side power transistor Qpwr_Hx. The gate charge profiler 650 may include a SigHx terminal coupled to the high-side input terminal 612 to receive the input signal Sig_Hx, a VdsHx terminal coupled to a drain terminal 652 of the gate driver IC 600, a VgsHx terminal coupled to the output gate terminal 607, a VsHx terminal coupled to the output source terminal 624, and a VthHx terminal coupled to a threshold voltage terminal 654 of the gate driver IC 600. The drain terminal 652 may be coupled to a drain DHx of the high-side power transistor Qpwr_Hx. The threshold voltage terminal 654 may be coupled to a source external to the gate driver IC 600, such as the controller 304 or a programmable resistor, to receive the threshold voltage VthHx. During the gate charge calibration phase, set forth above, the high-side gate driver 606 may be configured to output a relatively low and constant gate drive current IgHx to the gate GHx of the power transistor Qpwr_Hx in response to the input signal Sig_Hx. The gate charge profiler 650 may output a time value T_VAL_Hx at a time value output terminal 656 based on a comparison of at least one of the drain-source voltage VdsHx or the gate-source voltage VgsHx crossing the threshold voltage VthHx after input of the input signal Sig_Hx.

In some embodiments, the controller 304 may output the threshold voltages (i.e., Vth1, Vth2, Vth3) as the threshold voltage VthHx input to threshold voltage terminal 654 and receive as input the time values T_VAL1, T_VAL2, T_VAL3 as the time value T_VAL_Hx output from the time value output terminal 656. The controller 304 may then calculate the gate charges (i.e., Qgs, Qgd, Qod), as set forth above in Equations 2-6. After calculation of the gate charges, the controller 304 may output the switch control signal Vctl_Hx to the switch control terminal 640 and the input signal Sig_Hx to the high-side input terminal 612 to drive the high-side power transistor Qpwr_Hx with the gate drive current IgHx based on the calculated gate charges Qgs, Qgd, Qod. For example, the controller may vary the switch control signal Vctl_Hx and the input signal Sig_Hx to change a current value and/or time interval of the gate drive current IgHx to increase switching performance and/or reduce dead-time intervals of the power transistor Qpwr_Hx.

In some embodiments, the gate driver IC 600 may include a gate charge profiler 660 to determine gate charge characteristics of the low-side power transistor Qpwr_Lx. The gate charge profiler 660 may include a SigLx terminal coupled to the low-side input terminal 618 to receive the input signal Sig_Lx, a VdsLx terminal coupled to a drain terminal 662 of the gate driver IC 600, a VgsLx terminal coupled to the output gate terminal 609, a VsLx terminal coupled to an output source terminal 664 of the gate driver IC 600, and a VthLx terminal coupled to a threshold voltage terminal 666 of the gate driver IC 600. The drain terminal 662 may be coupled to a drain DLx of the low-side power transistor Qpwr_Lx. The threshold voltage terminal 666 may be coupled to a source external to the gate driver IC 600, such as the controller 304, to receive the threshold voltage VthLx. During the gate charge calibration phase, set forth above, the low-side gate driver 608 may be configured to output a relatively low and constant gate drive current IgLx to the gate GHx of the power transistor Qpwr_Lx, and the gate charge profiler 660 may output a time value T_VAL_Lx at a time value output terminal 668 based on a comparison of at least one of the drain-source voltage VdsLx, or the gate-source voltage VgsLx crossing the threshold voltage VthLx after input of the input signal Sig_Lx.

In some embodiments, the controller 304 may output the threshold voltages Vth1, Vth2, Vth3 as the threshold voltage VthLx input to the threshold voltage terminal 666 and receive as input the time values T_VAL1, T_VAL2, T_VAL3 as the time value T_VAL_Lx output from the time value output terminal 668. The controller 304 may then calculate the gate charges Qgs, Qgd, Qod, as set forth above in Equations 2-6. After calculation of the gate charges, the controller 304 may output the switch control signal Vctl_Lx to the switch control terminal 658 and the input signal Sig_Lx to the low-side input terminal 618 to drive the low-side power transistor Qpwr_Lx with the gate drive current IgLx based on the calculated gate charges Qgs, Qgd, Qod. For example, the controller may vary the switch control signal Vctl_Lx and the input signal Sig_Lx to change a current value and/or a time interval of the gate drive current IgLx to increase switching performance and/or reduce dead-time intervals of the power transistor Qpwr_Lx. In some embodiments, the controller 304 may vary the controls signals for all power transistors independently based on individual gate charge characteristics. In some embodiments, the controller 304 may vary the input signals Sig_Hx, Sig_Lx with shared configurations for high-side power transistors and shared configurations for low-side power transistors.

In some embodiments, the input signals Sig_Hx, Sig_Lx and/or the switch control signals Vctl_Hx, Vctl_Lx may include a minimum dead-time interval to minimize a shoot-through condition applied by the power transistors Qpwr_Hx, Qpwr_Lx to the load 604. In some embodiments, the switch control signal Vctl_Lx is derived from the switch control signal Vctl_Hx by way of a PWM generator 622. For example in the case of a BLDC, the load 604 may be windings of a BLDC pole and the switch control signals Vctl_Hx, Vctl_Lx may be complementary PWM signals with dead-time intervals between high-side and low-side PWM. The PWM generator 622 may include programmable registers for setting PWM levels of the switch control signal Vctl_Lx in relation to the switch control signal Vctl_Hx and the dead-time interval between the high-side and the low-side PWM. In some embodiments, the PWM generator 622 may set a minimum dead-time interval to minimize a shoot-through condition applied by the power transistors Qpwr_Hx, Qpwr_Lx to the load 604.

FIG. 6B illustrates the system 100 including the gate driver IC 600 configured to drive the power transistors Qpwr_Hx, Qpwr_Lx coupled at the switch node 602, according to some embodiments. In the example of FIG. 6B, the high-side input terminal 612 may be configured to input the input signal Sig_Hx as a PWM waveform for setting the reference current level Iprog_H. A low-pass filter 670 within the current generator 610 may filter the PWM waveform of Sig_Hx to provide a filtered voltage level. A voltage-to-current (V-to-I) converter 672 may use the filtered voltage level to set a current level for the reference current Iprog_H, as provided by a current source within the V-to-I converter 672.

As illustrated in FIG. 6B, the reference current Iprog_H flows through a first current mirror 674, which provides a current transfer multiplication of N and mirrors the reference current Iprog_H to provide a pull-down reference current Iref_pd_H=N*Iprog_H. The first current mirror 674 may comprise a first MOSFET through which Iprog_H, and N additional MOSFETs arranged in parallel, wherein a current Iprog_H flows through each of the N parallel MOSFETs yielding the output current Iref_pd_H=N*Iprog_H, as shown. Alternatively, the first current mirror 674 may include only a first MOSFET and a second MOSFET, wherein the size (channel length and width) of the second MOSFET may be larger than the first MOSFET, such that the second MOSFET provides a current N*Iprog_H. In other alternatives, BJTs or other transistor types may be used instead of MOSFETS.

A second current mirror 676 has a replica of the reference current Iprog_H flowing therethrough. As illustrated in FIG. 6B, such a replica may be provided by another mirror branch (e.g., a MOSFET) of the first current mirror 674. The second current mirror 676 may provide a current transfer multiplication of M, such that a mirrored pull-up reference current Iref_pu_H=M*Iprog_H flows through the second current mirror 676. The factors M and N need not be the same, and need not be integers. The pull-up and pull-down reference currents Iref_pu_H, Iref_pd_H are provided to the output stage 614. A power source (not shown) supplies the currents for the first and second current mirrors 674, 676.

In some embodiments, the output stage 614 includes a pull-up current mirror 678, a pull-up control switch QpuH, a pull-down current mirror 680, and a pull-down control switch QpdH. The pull-up current mirror 678 may be supplied from an output-stage power source VpwrHx and has the pull-up reference current Iref_pu_H flowing therethrough. The pull-up current mirror 678 provides a 1:K current transfer multiplication such that a pull-up current Ig_pu_H=K*Iref_pu_H flows from another branch of the pull-up current mirror 678. The pull-up control switch QpuH may switchably couple the pull-up current Ig_pu_H of the pull-up current mirror 678 to the output gate terminal 607, based upon the switch control signal Vctl_Hx. When the pull-up control switch QpuH is turned ON, the pull-up current Ig_pu_H flowing to the output gate terminal 607 may be used to charge the gate GHx of the high-side power transistor Qpwr_Hx. In some embodiments and as illustrated in FIG. 6B, the pull-up control switch QpuH is a p-channel MOSFET, such that a low voltage level may be applied to the gate to turn the control switch QpuH ON. Other switch types, e.g., n-channel MOSFET, BJT, IGBT, may alternatively be used as a pull-up control switch that controls whether or not current is sourced to the output gate terminal 607.

In some embodiments, the pull-down reference current Iref_pd_H flows through the pull-down current mirror 680, which provides a 1:H current transfer ratio such that a pull-down current Ig_pd_H=H*Iref_pd_H flows through another branch of the pull-down current mirror 292 when the pull-down control switch QpdH is turned ON. When the pull-down control switch QpdH is turned ON, the pull-down current Ig_pd_H flows from the output gate terminal 607 so as to discharge the gate GHx of the power transistor Qpwr_Hx. In some embodiments, the pull-down control switch QpdH is an n-channel MOSFET. Other switch types, e.g., BJT, IGBT, may alternatively be used as a pull-down switch that controls whether or not current is sunk from the output gate terminal 607. In some embodiments, the current generator 610 illustrated in FIG. 6B may be preferable in applications where the input signal Sig_Hx is a PWM waveform having an adjustable duty cycle. Other arrangements and/or configurations of the current generator 610 and the output stage 614 are within the scope of the present disclosure.

FIG. 6C illustrates the system 100 including the gate driver IC 600 configured to drive the high-side power transistor Qpwr_Hx and the low-side power transistor Qpwr_Lx of FIG. 6A, according to some embodiments. In the example of FIG. 6C, the system 100 includes the controller 304 that outputs the input signal Sig_Hx for setting the reference current Iprog_H. A low pass filter 681 may filter the input signal Sig_Hx output from the controller 304, providing an output voltage that determines a current I_ctl through the resistor R1 and supplied to a node 682. In some embodiments, the low pass filter 681 may filter the input signal Sig_Hx to achieve a DC (or near DC) signal such that the PWM signal controls the reference current Iprog_H. Low-pass filtering may be preferable for applications in which the reference current Iprog_H is not dynamically adjusted after the calibration phase or in applications in which the reference current Iprog_H provides a relatively slow adjustment. In some embodiments, the node 682 is provided between the resistor R1 and a resistor R2, such that a current I_r2 flows through resistor R2 to ground. In some embodiments, a combination of resistors R1, R2 may be configured to determine the current I_ctl. While a single input signal output is shown in FIG. 6C, the controller 304 may provide multiple input signal outputs.

In some embodiments, the high-side input terminal 612 may be coupled to an inverting input of a differential amplifier 684, such that a voltage input to the high-side input terminal 612 follows an internally-generated reference voltage Vref_H that is coupled to a non-inverting input of the differential amplifier 684. In some embodiments, the reference current Iprog_H may take a value of the current I_rs, such that the reference current Iprog_H=Vprog_ref/R2 flows through the MOSFET Q_H1 and the external resistor R2. The reference current Iprog_H may be relatively small, at least in comparison to the source and sink currents Ig_pu_H, Ig_pd_H provided at the output gate terminal 607, so as to limit the power loss incurred in the MOSFET Q_H1 and the resistor R2.

In some embodiments, the controller 304 may include a plurality of output terminals, such as general-purpose input/output (GPIO) terminals, to select one or more resistors R1, R2, . . . Rn, coupled to the high-side input terminal 612 to provide the input signal Sig_Hx and thereby control the reference current Iprog_H. In some embodiments, the controller 304 may include a digital-to-analog converter (DAC) that directly outputs a voltage to determine, in conjunction with the resistors R1, R2, the reference current Iprog_H. In some embodiments, the controller 304 may control an external programming resistor coupled between the high-side input terminal 612 and ground to provide the input signal Sig_Hx and thereby control the reference current Iprog_H. In some embodiments, the controller 304 may control a programmable voltage source coupled to the high-side input terminal 612 to provide the input signal Sig_Hx and thereby control the reference current Iprog_H. In some embodiments, the controller 304 may control a programmable current source coupled to the high-side input terminal 612 to provide the input signal Sig_Hx and thereby control the reference current Iprog_H.

In some embodiments, the controller 304 outputs the input signal Sig_Hx to the high-side input terminal 612, outputs the threshold voltage VthHx to the threshold voltage terminal 654, receives the time value T_VAL_Hx from the time value output terminal 656, and calculates a gate charge QgHx of the power transistor Qpwr_Hx based on a product of the gate drive current IgHx and the time value T_VAL_Hx. As set forth herein, the gate charge QgHx may be one of the gate charges Qgs, Qgd, Qod, the threshold voltage VthHx may be one of the threshold voltages Vth1, Vth2, Vth3, the time value T_VAL_Hx may be one of the time values T_VAL1, T_VAL2, T_VAL3, and the gate charge QgHx may be one of the gate charges Qgs, Qgd, Qod. After calculation of the gate charge QgHx, the controller 304 may output a second input signal Sig_Hx2 that controls a second gate drive current IgHx2 input to the gate GHx of the power transistor Qpwr_Hx during a time interval, wherein at least one of the second input signal Sig_Hx2 or the time interval is based on the gate charge QgHx. Other arrangements and/or configurations for providing the input signal Sig_Hx to the high-side input terminal 612 are within the scope of the present disclosure.

Figure 7:
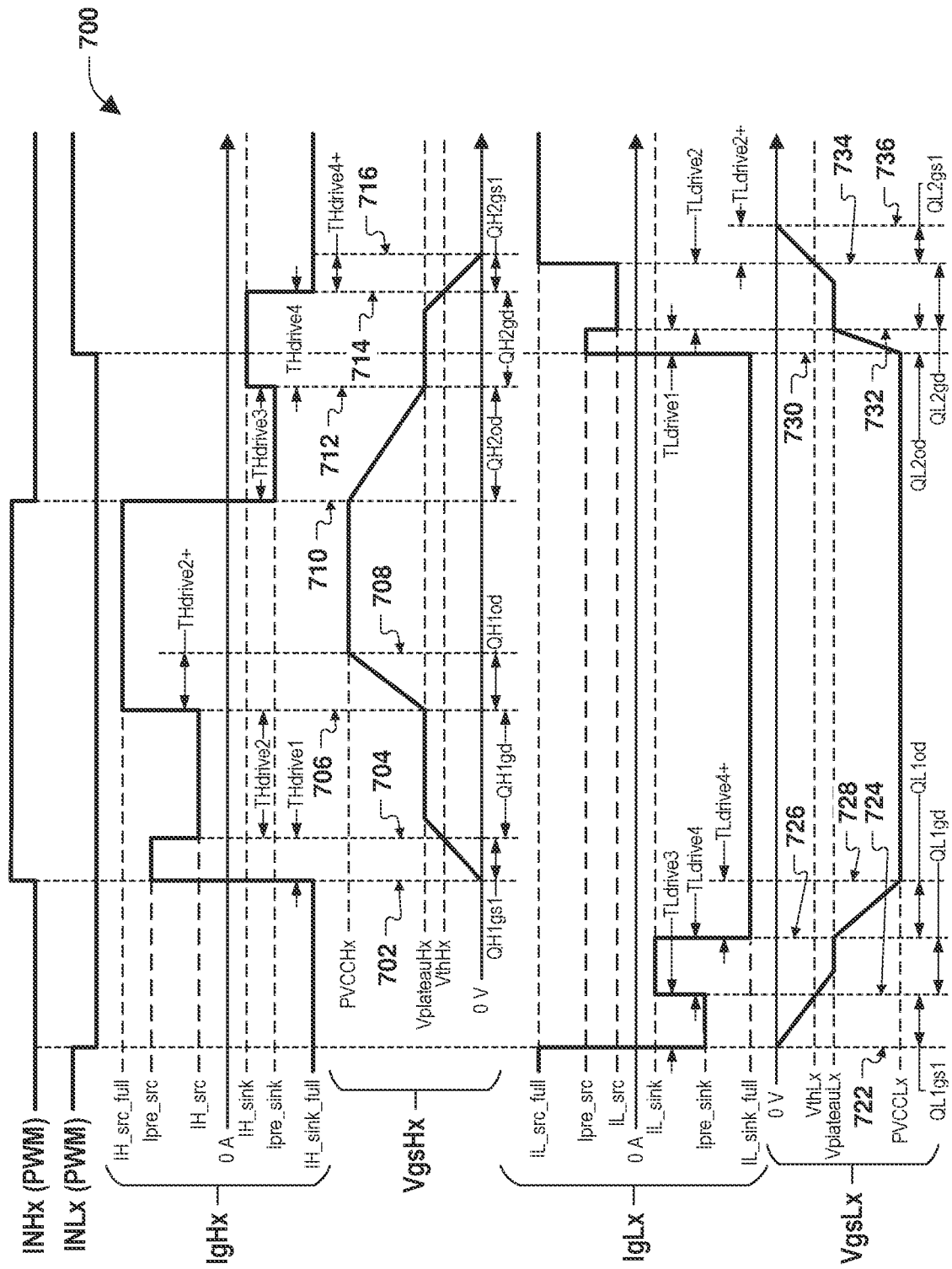
FIG. 7 is a graph illustrating a driving scheme for applying gate drive currents to power transistors, according to some embodiments.

FIG. 7 is a graph illustrating a driving scheme for applying gate drive currents to power transistors, according to some embodiments. In the example of FIG. 7, a graph 700 illustrates a high-side control signal INHx and a low-side control signal INLx. The control signal INHx controls a high-side gate drive current IgHx applied to the gate GHx of the high-side power transistor Qpwr_Hx and the control signal INLx controls a low-side gate drive current IgLx applied to the gate GLx of the low-side power transistor Qpwr_Lx. After determination of the effective gate charge characteristics of the power transistors Qpwr_Hx, Qpwr_Lx, as set forth above, an optimal slew rate configuration may be provided by varying the gate drive currents IgHx, IgLx and time intervals of the gate drive currents.

In some embodiments illustrated by the graph 700, the gate drive current IgHx may be applied to the gate GHx of the high-side power transistor Qpwr_Hx in response to the control signal INHx. The gate drive current IgHx may include several gate drive currents applied during different time intervals based on gate charge characteristics illustrated with reference to the gate-source voltage VgsHx. In some embodiments, the gate current IgHx MAY include gate drive currents IH_src_full, Ipre_src, IH_src, IH_sink, Ipre_sink, and IH_sink_full, which may be variously applied during time intervals THdrive1, THdrive2, THdrive3, and THdrive4. Propagation delays of a gate driver to apply the gate drive current values with the time intervals are omitted in FIG. 7 for clarity.

In some embodiments, before the control signal INHx is pulsed to a high state, the gate drive current IH_sink_full may be applied to the gate GHx. When the control signal INHx pulses to the high state, indicated by a reference line 702, the gate drive current Ipre_src may be applied to the gate GHx for the time interval THdrive1, which may be determined as set forth above according to the gate charge QH1$gs$1. The time interval THdrive1 ends at a reference line 704 when the gate-source voltage VgsHx crosses the threshold VthHx. The gate drive current IH_src may then be applied to the gate GHx for the time interval THdrive2, which may be determined as set forth above according to the gate charge QH1$gd$. The time interval THdrive2 ends at a reference line 706 when the gate-source voltage VgsHx reaches the end of the Plateau Region having the voltage VplateauHx. The gate-source voltage VgsHx then increases to a gate drive voltage PVCCHx at a reference line 708. At the end of the time interval THdrive2, the gate drive current IH_src_full may be applied to the gate GHx until the end of the pulse of the control signal INHx, as indicated at a reference line 710.

At the end of the pulse of the control signal INHx, indicated at the reference line 710, the gate drive current Ipre_sink is applied to the gate GHx for the time interval THdrive3, which ends at a reference line 712. The time interval THdrive3 may be determined according to the gate charge QH2$od$. At the reference line 712, the gate drive current value IH_sink may be applied to the gate GHx for the time interval THdrive4, which ends at a reference line 714. The time interval THdrive4 may be determined according to the gate charge QH2$gd$. At the reference line 714, the gate drive current IH_sink_full may be applied to the gate GHx and the gate-source voltage VgsHx ramps downward to 0 V at a reference line 716 according to the gate charge QH2$gs$1. In some embodiments, the gate drive current IH_sink_full is applied to the gate GHx until initiation of a next pulse of the control signal INHx. In accordance with aspects of the present disclosure, the several currents of the gate drive current IgHx (e.g., IH_src_full, IH_sink, Ipre_src, Ipre_sink, IH_src, IH_sink_full), and the time intervals (e.g., THdrive1, THdrive2, THdrive2+, THdrive3, THdrive4, THdrive4+) may be varied to optimize switching performance and reduce dead-time intervals of the high-side power transistor for the turn ON/OFF process.

In some embodiments illustrated by the graph 700, the gate drive current IgLx may be applied to the gate GLx of the low-side power transistor Qpwr_Lx in response to the control signal INLx. The gate drive current IgLx may be applied with gate drive currents and time intervals based on gate charge characteristics illustrated with reference to the gate-source voltage VgsLx. The gate current IgLx includes gate drive currents IL_src_full, Ipre_src, IL_src, IL_sink, Ipre_sink, and IL_sink_full, which may be variously applied during time intervals TLdrive1, TLdrive2, TLdrive2+, TLdrive3, TLdrive4, and TLdrive4+. Propagation delays of a gate driver to apply the gate drive current values with the time intervals are omitted in FIG. 7 for clarity.

In some embodiments, before input of the control signal INLx, the gate drive current IL_src_full may be applied to the gate GLx. In response to a pulse of the control signal INLx to a low state, indicated by a reference line 722, the gate drive current Ipre_sink is applied to the gate GLx for the time interval TLdrive3, which may be determined according to the gate charge QL1gs1. The time interval TLdrive3 ends at a reference line 724 when the gate-source voltage VgsLx crosses the threshold VthLx. The gate drive current IL_sink is then applied to the gate GLx for the time interval TLdrive4, which may be determined according to the gate charge QL1gd. The time interval TLdrive4 ends at a reference line 726 when the gate-source voltage VgsLx reaches the end of the Plateau Region having the voltage VplateauLx. The gate-source voltage VgsLx then decreases to a gate drive voltage PVCCLx indicated by a reference line 728. At the end of the time interval TLdrive4, the gate drive current IL_sink_full may be applied to the gate GLx until the end of the pulse of the control signal INLx, as indicated at a reference line 730.

At the end of the pulse of the control signal INLx, indicated at the reference line 730, the gate drive current Ipre_src may be applied to the gate GLx for the time interval TLdrive1, which ends at a reference line 732. The time interval TLdrive1 may be determined according to the gate charge QL2od. At the reference line 732, the gate drive current IL_src may be applied to the gate GLx for the time interval TLdrive2, which ends at a reference line 734. The time interval TLdrive2 may be determined according to the gate charge QL2gd. At the reference line 734, the gate drive current IL_src_full may be applied to the gate GLx and the gate voltage VgsLx ramps upward to 0 V at a reference line 736 according to the gate charge QL2gs1. In some embodiments, the gate drive current IL_src_full may be applied to the gate GLx until initiation of a next pulse of the control signal INLx. In accordance with aspects of the present disclosure, the currents of the gate drive current IgLx (e.g., IL_src_full, IL_sink, Ipre_src, Ipre_sink, IL_src, IL_sink_full), and the time intervals (e.g., TLdrive3, TLdrive4, TLdrive4+, TLdrive1, TLdrive2, TLdrive2+) may be applied to optimize switching performance and reduce dead-time intervals of the high-side power transistor for the turn ON/OFF process.

In some embodiments, the controller 304 may generate one more input signals to control the gate drive currents after determination of the gate charge characteristics of the power transistors. For example with reference to a turn ON process for the high-side power transistor Qpwr_Hx, the gate charge profiler may have previously determined the gate charge QH1gs1, the gate charge QH1gd, and the gate charge QH1od. The controller 304 may output a second input signal SigHx2 that controls the gate drive current Ipre_src input to the gate GHx of the power transistor Qpwr_Hx during the time interval THdrive1. In this example, at least one of the second input signal SigHx2 or the time interval THdrive1 is based on the gate charge QH1gs1 according to Equation 1 set forth above. The controller 304 may output a third input signal SigHx3, that controls the gate drive current IH_src input to the gate GHx of the power transistor Qpwr_Hx during the time interval THdrive2. In this example, at least one of the third input signal SigHx3 or the time interval THdrive2 is based on the second gate charge QH1gd according to Equation 1 set forth above. The controller 304 may output a fourth input signal SigHx4 that controls the gate drive current IH_src_full input to the gate GHx of the power transistor Qpwr_Hx during the time interval THdrive2+ (between the reference line 706 and the reference line 708). In this example, at least one of the fourth input signal SigHx4 or the time interval THdrive2+ is based on the gate charge QH1od according to Equation 1 set forth above. Other arrangements and/or configurations for controlling the control signals INHx, INLx, the gate drive currents IgHx, IgLx, and the high-side time intervals THdrive1, THdrive2, THdrive2+, THdrive3, THdrive4, THdrive4+, and the low-side time intervals TLdrive3, TLdrive4, TLdrive4+, TLdrive1, TLdrive2, TLdrive2+ are within the scope of the present disclosure.

Figure 8A:
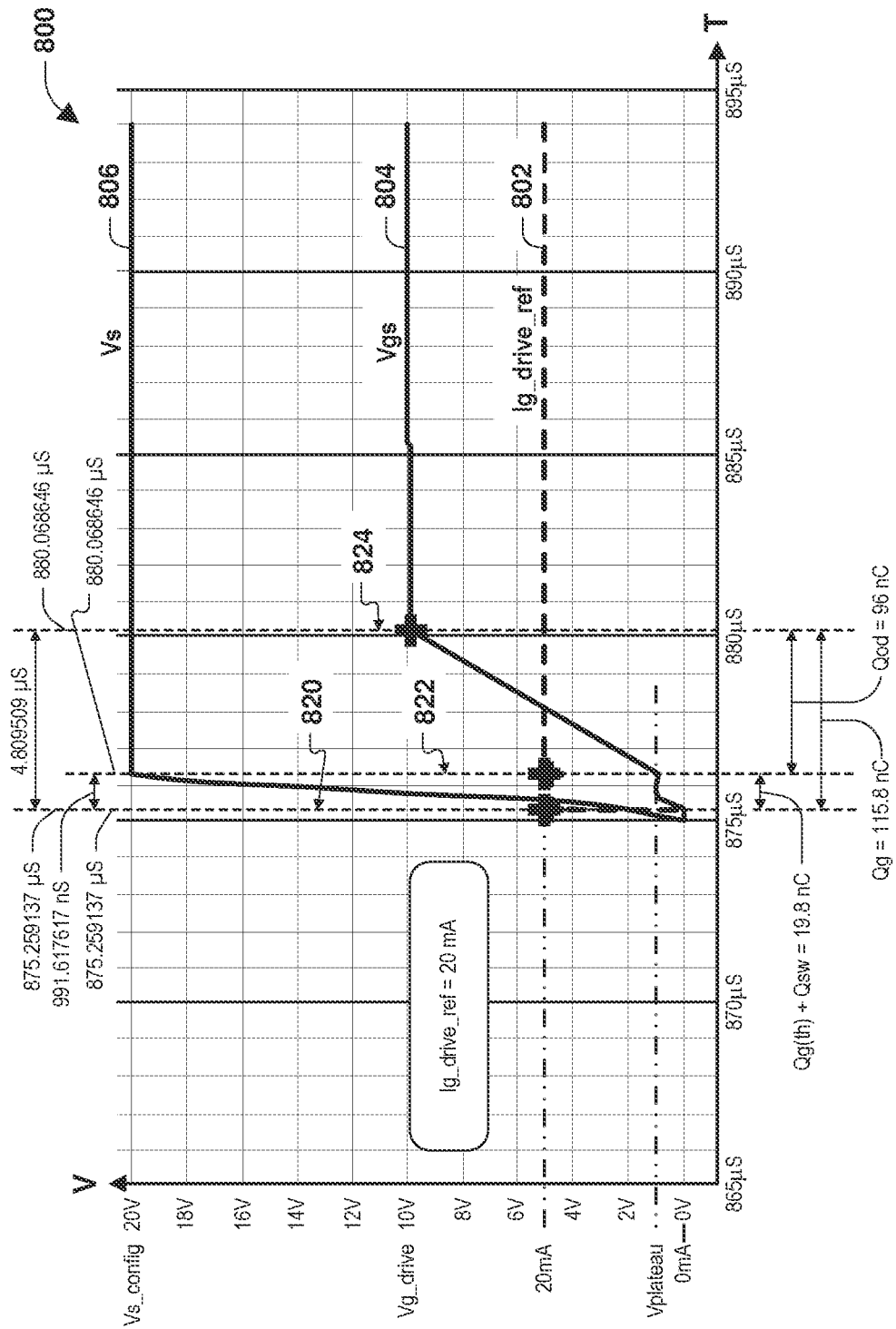
FIGS. 8A-8C are illustrations of simulated gate charge characteristics for a sample power transistor, according to some embodiments.
Figures 8B, 8C:
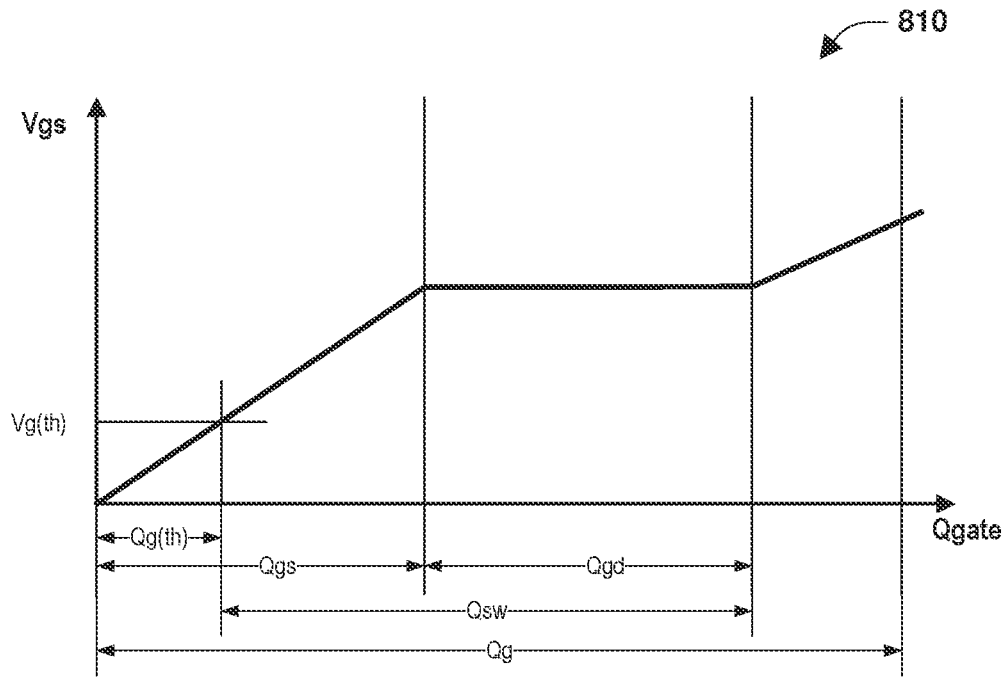

FIGS. 8A-8C are illustrations of simulated gate charge characteristics for a sample power transistor, according to some embodiments. FIG. 8A illustrates a graph 800 of simulated signals including a reference current signal 802, a gate-source voltage signal 804, and a source voltage signal 806 of a sample MOSFET power transistor. FIG. 8B illustrates a graph 810 of typical gate charge characteristics that may be provided from a datasheet of the sample MOSFET power transistor, and FIG. 8C illustrates a table 812 of typical gate charge values that may be provided from a datasheet of the sample MOSFET power transistor. FIGS. 8A-8C correspond to characteristics of the sample MOSFET power transistor configured as a MOSFET BSC010N04LS by Infineon AG, and characteristics of the sample gate driver IC configured as a 6EDL7141 gate driver by Infineon AG.

As illustrated in FIG. 8A, the graph 800 includes a vertical axis of volts (V) measured in volts and a horizontal axis of time (T) measured in micro seconds, where dashed reference lines are exaggerated for clarity. The reference current signal 802 (Ig_drive_ref) is superimposed on the graph 800 with the vertical axis measured in milliamps. To determine gate charge characteristics, the reference current signal 802 corresponds to a reference current Ig_drive_ref=20 mA, which is applied to the gate of the sample MOSFET power transistor. The reference current signal 802 initiates a change to the gate-source voltage signal 804 at a reference line 820, which has a value of 875.259137 µS. The gate-source voltage signal 804 begins to ramp upward to the plateau voltage Vplateau as the source voltage signal 806 begins to ramp upward to a configured source voltage Vs_config. The plateau voltage Vplateau illustrates a Plateau Region, which ends at a reference line 822 and has a value of 880.068646 µS. The source voltage signal 806 also reaches the configured source voltage Vs_config at the end of the Plateau Region at reference line 822. Accordingly, a time interval from the reference line 820 to the reference line 822 is 991.617617 nS, which corresponds to a gate charge Qg(th)+Qsw=19.8 nC. A reference line 824 indicates a time when the gate-source voltage Vgs reaches the configured gate drive voltage Vg_drive and has a value of 880.068646 µS. A time interval of 4.809509 µS is provided between the reference line 820 and the reference line 824 with a corresponding gate charge Qg=115.8 nC. The gate charge Qod may be determined through subtraction according to Equation 6, Qod=Qg−(Qg(th)+Qsw), to obtain Qod=96 nC.

As illustrated by FIG. 8C in table 812, device datasheet gate charge characteristics are provided at a drain current Id=50 A, and provide typical values of Qg=95 nC; Qg(th)=11 nC; Qsw=21 nC; (Qg(th)+Qsw)=32 nC; and Qod=Qg−(Qg(th)+Qsw))=63 nC. Accordingly, the simulated gate charge characteristic of Qg(th)+Qsw=19.8 nC represents a 38% change from the datasheet gate charge characteristic of Qg(th)+Qsw=32 nC. The simulated gate charge characteristic of Qod=96 nC represents a 52% change from the datasheet gate charge characteristic Qod=63 nC. The above indicates that changes to configured parameters may significantly impact gate charge characteristics when compared to static device datasheet values. In-system parameters such as temperature, packaging parasitics, PCB parasitics, etc. may not be readily determined from simulated conditions. In accordance with aspects of the present disclosure, gate charge characteristics of in-system gate drivers and power transistors may be determined to optimize switching performance over datasheet gate charge characteristics, which may not be configured in view of in-system parameters, such as configured gate drive currents, temperature response, in-system parasitics, etc.

Figure 9A:
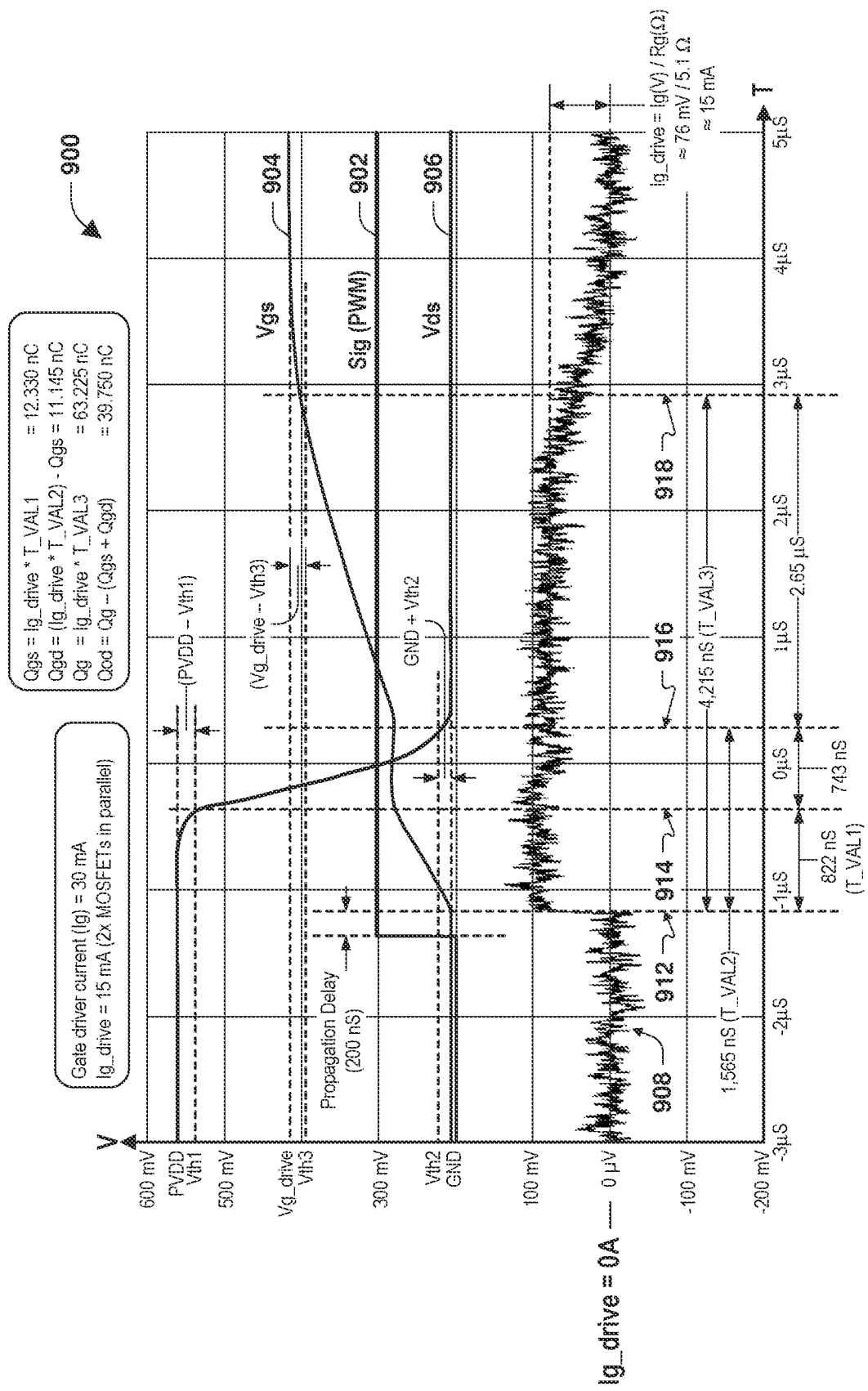

FIGS. 9A-9B are illustrations of tested gate charge characteristics for a sample power transistor, according to some embodiments. FIG. 9A illustrates a graph 900 of tested hardware signals including an input signal 902 (Sig), a gate-source voltage 904, and a drain-source voltage 906 of a pair of sample MOSFET power transistors arranged in parallel. Superimposed on the graph 900 is a gate drive current 908 (Ig_drive) applied to the pair of sample MOSFET power transistors in response to the input signal 902. FIG. 9B illustrates a table 812 of gate charge values from a datasheet of the sample MOSFET power transistors. FIGS. 9A-9B correspond to characteristics of the sample MOSFET power transistors, each configured as a MOSFET BSC030N08NS5 by Infineon AG, and characteristics of a sample gate driver IC configured as a 6EDL7141 gate driver by Infineon AG.

As illustrated by the graph 900 of FIG. 9A, the gate drive current 908 is applied to the gates of the pair of MOSFET power transistors and is limited to 30 mA total, such that a gate drive current of Ig_drive≈15 mA is applied to each gate of the pair of MOSFET power transistors. The gate drive current 908 corresponds to the input signal 902, according to the formula Ig_drive=Ig(V)/Rg(Ω)≈76 mV/5.1Ω≈15 mA, where Ig(V) is a gate voltage and Rg(0) is a gate resistance of the MOSFET power transistors.

As illustrated in FIG. 9A, the input signal 902 is a PWM signal. A propagation delay of 200 nS is a time interval taken by the gate driver before the gate-source voltage 904 begins to ramp upward in response to the input signal 902. A reference line 912 indicates an end of the propagation delay of the gate driver and provides a reference for determination of the gate charge characteristics. A reference line 914 indicates a time when the drain-source voltage Vds falls below the first threshold voltage Vth1. In accordance with some embodiments set forth above, the first time value T_VAL1=822 nS is determined and corresponds to a time interval between the reference line 912 and the reference line 914. A reference line 916 indicates a time when the drain-source voltage Vds falls below the second threshold voltage Vth2. In accordance with some embodiments set forth above, the second time value T_VAL2=1,565 nS is determined and corresponds to a time interval between the reference line 912 and the reference line 916. A reference line 918 indicates a time when the gate-source voltage Vgs rises above the third threshold voltage Vth3. In accordance with some embodiments set forth above, the third time value T_VAL3=4,215 nS is determined and corresponds to a time interval between the reference line 912 and the reference line 918. The tested gate charge characteristics of each tested power transistor may be determined according to Equations 2-6, as follows. The tested gate charge Qgs=Ig*T_VAL1=15 mA*822 nS=12.330 nC. The tested gate charge Qgd=(Ig*T_VAL2)-Qgs=(15 mA*1,565 nS)-12.330 nC=23.475 nC-12.330 nC=11.145 nC. The tested gate charge Qg=Ig*T_VAL3=15 mA*4,215 nS=63.225 nC. The tested gate charge Qod=Qg-(Qgs+Qgd)=63.225 nC-(12.330 nC+11.145 nC)=39.750 nC.

As illustrated by FIG. 9B in table 812, the datasheet gate charge characteristics are provided at a drain current Id=50 A, and provide typical values of Qgs=20 nC; Qgd=13 nC; Qg=61 nC; and Qod=Qg-(Qg(th)+Qsw)=63 nC. Accordingly, the tested gate charge characteristic of Qgs=12.330 nC represents a 38% change from the datasheet gate charge characteristic of Qgs=20 nC. The tested gate charge characteristic of Qgd=11.145 represented a 14% change from the datasheet gate charge characteristic of Qgd=13 nC. The tested gate charge characteristic of Qod=39.750 nC represents a 37% change from the datasheet gate charge characteristic Qod=63 nC. The above indicates that tested gate charge characteristics may significantly vary from datasheet gate charge characteristics. In-system parameters such as temperature, packaging parasitics, PCB parasitics, etc. may also vary based upon individual circuit elements and individual element configurations. In accordance with aspects of the present disclosure, gate charge characteristics of in-system gate drivers and power transistors may be determined to optimize switching performance over datasheet gate charge characteristics, which may not be configured in view of in-system parameters, such as configured gate drive currents, temperature response, in-system parasitics, etc.

FIG. 10 is a diagram of example components of a device, according to some embodiments. The device 1000 may correspond to the gate driver IC 150, the controller 340, the gate driver IC 306, the gate driver IC 600 and/or another device for controlling the system 100. As illustrated in FIG. 10, the device 1000 may include a bus 1010, a processor 1020, a memory 1030, a storage component 1040, an input component 1050, an output component 1060, and a communication interface 1070. The bus 1010 includes a component that permits communication among the components of the device 1000. The processor 1020 is implemented in hardware, firmware, or a combination of hardware and software. The processor 1020 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, the processor 1020 includes one or more processors capable of being programmed to perform a function. The memory 1030 includes a random access memory (RAM), a read only memory (ROM), an electrically erasable programmable read-only memory (EEPROM), a serial peripheral interface (SPI) memory, one or more storage registers, and/or another type of dynamic or static storage device (e.g., a flash memory, a magnetic memory, and/or an optical memory) that stores information and/or instructions for use by the processor 1020.

In some embodiments, the storage component 1040 stores information and/or software related to the operation and use of the device 1000. For example, the storage component 1040 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive. The input component 1050 includes a component that permits the device 1000 to receive information, such as via user input (e.g., a touch screen display, a keyboard, a keypad, a mouse, a button, a switch, and/or a microphone) and/or another hardware element. Additionally, or alternatively, the input component 1050 may include a sensor for sensing information (e.g., a global positioning system (GPS) component, an accelerometer, a gyroscope, and/or an actuator). The output component 1060 includes a component that provides output information from device 1000 (e.g., a display, a speaker, and/or one or more light-emitting diodes (LEDs)). The communication interface 1070 includes a transceiver-like component (e.g., a transceiver and/or a separate receiver and transmitter) that enables the device 1000 to communicate with other devices, such as via a wired connection, a wireless connection, or a combination of wired and wireless connections. The communication interface 1070 may permit the device 1000 to receive information from another device and/or provide information to another device. For example, the communication interface 1070 may include an Ethernet interface, an optical interface, a coaxial interface, an infrared interface, a radio frequency (RF) interface, a universal serial bus (USB) interface, a Wi-Fi interface, a cellular network interface, and/or the like.

In some embodiments, the device 1000 may perform one or more processes described herein. The device 1000 may perform these processes based on the processor 1020 executing software instructions stored by a non-transitory computer-readable medium, such as the memory 1030 and/or the storage component 1040. A computer-readable medium is defined herein as a non-transitory memory device. A memory device includes memory space within a single physical storage device or memory space spread across multiple physical storage devices. Software instructions may be read into the memory 1030 and/or the storage component 1040 from another computer-readable medium or from another device via the communication interface 1070. When executed, software instructions stored in the memory 1030 and/or the storage component 1040 may cause the processor 1020 to perform one or more processes described herein. Additionally, or alternatively, hardwired circuitry may be used in place of or in combination with software instructions to perform one or more processes described herein. Thus, implementations described herein are not limited to any specific combination of hardware circuitry and software. The number and arrangement of the components shown in FIG. 10 are provided as an example. In practice, the device 1000 may include additional components, fewer components, different components, or differently arranged components than those shown in FIG. 10. Additionally, or alternatively, a set of components (e.g., one or more components) of device 1000 may perform one or more functions described as being performed by another set of components of the device 1000.

Figure 11:
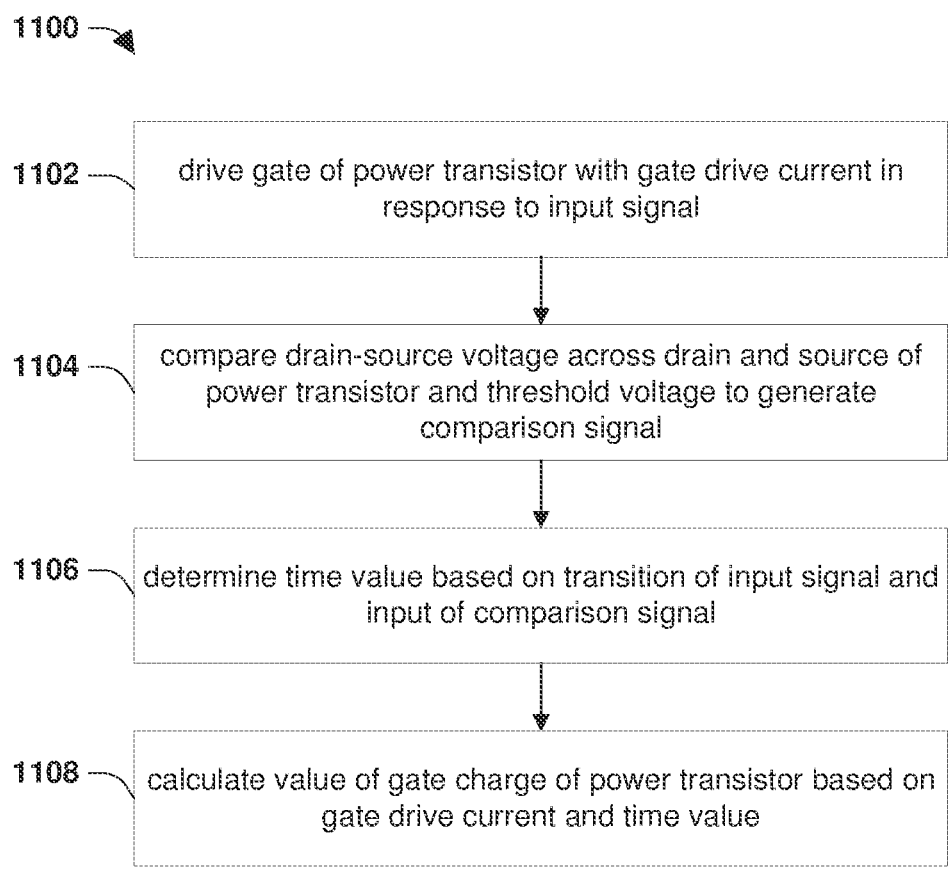
FIG. 11 illustrates a flowchart of a method, according to some embodiments.

FIG. 11 illustrates a flowchart of a method, according to some embodiments. A method 1100 may profile gate charge characteristics of the power transistor Qpwr in the system 100 described above with reference to FIG. 1 and FIGS. 2A-2B. At 1102, the gate driver 140 drives the gate G of the power transistor Qpwr with a gate drive current Ig_drive in response to the input signal Sig to control conduction between the drain D and the source terminal S of the power transistor Qpwr.

At 1104, the voltage comparator unit 120 compares an input voltage from the comparator input terminal 104 coupled to the drain-source voltage Vds across the drain D and the source S of the power transistor Qpwr and the threshold voltage Vth from the threshold voltage terminal 106 to generate the comparison signal CS. In some examples, the voltage comparator unit 120 compares the input voltage from the comparator input terminal 104 coupled to the gate-source voltage Vgs across the gate G and the source S of the power transistor Qpwr and the threshold voltage Vth from the threshold voltage terminal 106 to generate the comparison signal CS.

At 1106, the timer unit 130 determines the time value T_VAL based on input of the input signal Sig and input of the comparison signal CS. In some examples, the time value T_VAL may be one of the first time value T_VAL1, the second time value T_VAL2, or the third time value T_VAL3 for the turn ON process of the power transistor Qpwr illustrated in FIG. 2A. The first time value T_VAL1 may be the time interval from initiation of the gate drive current Ig_drive until the gate-source voltage Vgs of the power transistor Qpwr reaches the Plateau Region. The second time value T_VAL2 may be the time interval from initiation of the gate drive current Ig_drive until the gate-source voltage Vgs (and the drain-source voltage Vds) reaches the end of the Plateau Region. The third time value T_VAL3 may be the time interval from initiation of the gate drive current Ig_drive until the gate-source voltage Vgs reaches the configured gate drive voltage Vg_drive. In some examples, the time value T_VAL may be one of the fourth time value T_VAL4, the fifth time value T_VAL5, or the sixth time value T_VAL6 for the turn OFF process of the power transistor Qpwr illustrated in FIG. 2B. The fourth time value T_VAL4 may be the time interval from stopping of the gate drive current Ig_drive until the gate-source voltage Vgs of the power transistor Qpwr reaches the Plateau Region at the plateau voltage Vplateau. The fifth time value T_VAL5 may be the time interval from stopping of the gate drive current Ig_drive until the gate-source voltage Vgs (and the drain-source voltage Vds) reaches the end of the Plateau Region. The sixth time value T_VAL6 may be the time interval from stopping of the gate drive current Ig_drive until the gate-source voltage Vgs reaches ground GND.

At 1108, the controller 304 calculates the gate charge Qg of the power transistor Qpwr based on the gate drive current Ig_drive and the time value T_VAL. In some examples, the gate charge Qg may be one of the gate charges Qgs, Qgd, Qod and the time value T_VAL may be one of the time values T_VAL1, T_VAL2, T_VAL3. The gate charge Qgs may be calculated based on the gate drive current Ig_drive and the first time value T_VAL1 according to Equation 2. The gate charge Qgd may be calculated based on the gate drive current Ig_drive, the second time value T_VAL2, and the gate charge Qgs according to Equations 2-4. The gate charge Qod may be calculated based on the gate drive current Ig_drive, the third time value T_VAL3, and the gate charges Qgs, Qgd according to Equations 2-6. In some examples, the gate charge Qg may be one of the gate charges Q2od, Q2gd, Q2gs and the time value T_VAL may be one of the time values T_VAL4, T_VAL5, T_VAL6. The gate charge Q2od may be calculated based on the gate drive current Ig_drive and the fourth time value T_VAL4 according to Equation 7. The gate charge Q2gd may be calculated based on the gate drive current Ig_drive, the fifth time value T_VAL5, and the gate charge Q2od according to Equations 8-9. The gate charge Q2gs may be calculated based on the gate drive current Ig_drive, the sixth time value T_VAL6, and the gate charges Q2od, Q2gd according to Equations 7-11. Other arrangements and/or configurations for calculating gate charge characteristics are within the scope of the present disclosure.

Although the present disclosure is not so limited, the following numbered examples demonstrate one or more aspects of the disclosure.

Example 1. A device, comprising: a gate charge profiler circuit, comprising: a current input terminal configured to receive an input signal that controls a gate drive current, wherein the gate drive current drives a gate of a power transistor to control conduction between a drain and a source of the power transistor. A comparator input terminal is configured to receive an input voltage, wherein the input voltage is a drain-source voltage across the drain and the source, or a gate-source voltage across the gate and the source. A threshold voltage terminal is configured to receive a threshold voltage. A voltage comparator unit, having a first comparator input coupled to the comparator input terminal and a second comparator input coupled to the threshold voltage terminal, is configured to generate a comparison signal based on a comparison of the input voltage and the threshold voltage. A timer unit, having a first timer input coupled to the current input terminal and a second timer input coupled to a comparator output of the voltage comparator unit, is configured to determine a time value based on input of a transition of the input signal and input of the comparison signal, wherein a gate charge of the power transistor corresponds to the gate drive current and the time value.

Example 2. The device of example 1, wherein the input signal is a PWM signal and the timer unit starts determination of the time value based on a transition edge of the PWM signal and stops determination of the time value based on a transition edge of the comparison signal.

Example 3. The device of any of examples 1-2 or any combination thereof, comprising: a controller, configured to: output the input signal to the current input terminal; receive the time value from a timer output of the timer unit; and calculate a value of the gate charge of the power transistor based on a product of the gate drive current and the time value.

Example 4. The device of any of examples 1-3 or any combination thereof, wherein the controller is further configured to: output a second input signal that controls a second gate drive current to drive the gate of the power transistor during a time interval, wherein at least one of a value of the second gate drive current or the time interval is based on the calculated value of the gate charge.

Example 5. The device of any of examples 1~4 or any combination thereof, wherein the threshold voltage is a predetermined voltage below an initial drain-source voltage of the power transistor, and wherein the drain-source voltage slews from an initial drain-source voltage to the threshold voltage as the gate drive current drives the gate of the power transistor to turn the power transistor ON.

Example 6. The device of any of examples 1-5 or any combination thereof, wherein the threshold voltage is a predetermined voltage above a ground voltage coupled to the source of the power transistor, and wherein the drain-source voltage slews from an initial drain-source voltage to the threshold voltage and the gate-source voltage maintains a gate plateau voltage as the gate drive current drives the gate of the power transistor to turn the power transistor ON.

Example 7. The device of any of examples 1-6 or any combination thereof, wherein the threshold voltage is a predetermined voltage below a configured gate drive voltage of the power transistor, and wherein the gate-source voltage slews from an initial gate-source voltage to the configured gate drive voltage as the gate drive current drives the gate of the power transistor to turn the power transistor ON.

Example 8. The device of any of examples 1-7, wherein the threshold voltage terminal is further configured to receive a second threshold voltage and a third threshold voltage. The voltage comparator unit is further configured to: generate a second comparison signal based on a comparison of the input voltage and the second threshold voltage; and generate a third comparison signal based on a comparison of the input voltage and the third threshold voltage. The timer unit is further configured to: determine a second time value based on input of the transition of the input signal and input of the second comparison signal; and determine a third time value based on input of the transition of the input signal and input of the third comparison signal. A second gate charge of the power transistor corresponds to the gate drive current and the second time value, and a third gate charge of the power transistor corresponds to the gate drive current and the third time value.

Example 9. The device of any of examples 1-8 or any combination thereof, comprising: a controller, configured to: output the input signal to the current input terminal; receive the time value, the second time value, and the third time value from a timer output of the timer unit; calculate a value of the gate charge based on the gate drive current and the time value; calculate a second value of the second gate charge based on the gate drive current and the second time value; and calculate a third value of the third gate charge based on the gate drive current and the third time value.

Example 10. The device of any of examples 1-9 or any combination thereof, wherein the controller is further configured to: calculate the value of the gate charge by multiplying the gate drive current and the time value; calculate the second value of the second gate charge by multiplying the gate drive current and the second time value to obtain a first product, and subtracting the calculated value of the gate charge from the first product; and calculate the third value of the third gate charge by multiplying the gate drive current and the third time value to obtain a second product, and subtracting the calculated value of the gate charge and the calculated second value of the second gate charge from the second product.

Example 11. The device of any of examples 1-10, or any combination thereof, wherein a controller is configured to: output one or more additional input signals that control one or more gate drive currents to drive the gate of the power transistor.

Example 12. The device of any of examples 1-11 or any combination thereof, wherein the voltage comparator unit is further configured to: generate the comparison signal when the drain-source voltage equals the threshold voltage; generate the second comparison signal when the drain-source voltage equals the second threshold voltage; and generate the third comparison signal when the gate-source voltage equals the third threshold voltage.

Example 13. The device of any of examples 1-12 or any combination thereof, wherein the input signal transitions from an OFF state to an ON state to control the gate drive current to drive the gate of the power transistor and turn the power transistor ON, and wherein the voltage comparator unit generates the comparison signal when the input voltage slews from an initial input voltage to the threshold voltage.

Example 14. The device of any of examples 1-12 or any combination thereof, wherein the input signal transitions from an ON state to an OFF state to control the gate drive current to stop driving the gate of the power transistor and turn the power transistor OFF, and wherein the voltage comparator unit generates the comparison signal when the input voltage slews from an initial input voltage to the threshold voltage.

Example 15. A gate charge profiler system, comprising: a power transistor comprising a gate that controls conduction between a drain and a source; and a gate driver configured to drive the gate of the power transistor with a gate drive current in response to an input signal. The system further comprising: a gate charge profiler, comprising: an analog comparator configured to generate a comparison signal when a drain-source voltage across the drain and the source equals a threshold voltage; and a timer arranged subsequent to the analog comparator and configured to output a time value based on input of a transition of the input signal and input of the comparison signal. The system further comprising: a controller, configured to: output the input signal to the gate driver and the timer; and calculate a value of a gate charge of the power transistor based on the gate drive current and the time value.

Example 16. The gate charge profiler system of example 15, the gate charge profiler further comprising: a second analog comparator configured to generate a second comparison signal when the drain-source voltage equals a second threshold voltage; and a second timer arranged subsequent to the second analog comparator and configured to output a second time value based on input of the transition of the input signal and input of the second comparison signal. The controller further configured to calculate a second value of a second gate charge of the power transistor based on the gate drive current and the second time value.

Example 17. The gate charge profiler system of any of examples 15-16 or any combination thereof, the gate charge profiler further comprising: a third analog comparator configured to generate a third comparison signal when a gate-source voltage across the gate and the source equals a third threshold voltage; and a third timer arranged subsequent to the third analog comparator and configured to output a third time value based on input of the transition of the input signal and input of the third comparison signal. The controller further configured to calculate a third value of a third gate charge of the power transistor based on the gate drive current and the third time value.

Example 18. The gate charge profiler system of any of examples 15-17 or any combination thereof, the controller further configured to: calculate the value of the gate charge as a function of one or more gate drive currents and one or more time values.

Example 19. The gate charge profiler system of any of examples 15-18 or any combination thereof, wherein the input signal transitions from an OFF state to an ON state to control the gate drive current to drive the gate of the power transistor and turn the power transistor ON, and wherein the analog comparator generates the comparison signal when the drain-source voltage slews from an initial drain-source voltage to the threshold voltage.

Example 20. The gate charge profiler system of any of examples 15-18 or any combination thereof, wherein the input signal transitions from an ON state to an OFF state to control the gate drive current to stop driving the gate of the power transistor and turn the power transistor OFF, and wherein the analog comparator generates the comparison signal when the drain-source voltage slews from an initial drain-source voltage to the threshold voltage.

Example 21. A method, comprising: driving, by a gate driver, a gate of a power transistor with a gate drive current in response to an input signal to control conduction between a drain and a source of the power transistor; comparing, by a voltage comparator unit, a drain-source voltage across the drain and the source and a threshold voltage to generate a comparison signal; determining, by a timer unit, a time value based on input of a transition of the input signal and input of the comparison signal; and calculating, by a controller, a value of a gate charge of the power transistor based on the gate drive current and the time value.

Example 22. The method of example 21, comprising: comparing, by the voltage comparator unit, the drain-source voltage and a second threshold voltage to generate a second comparison signal; determining, by the timer unit, a second time value based on input of the transition of the input signal and input of the second comparison signal; and calculating, by the controller, a second value of a second gate charge of the power transistor based on the gate drive current, the second time value, and the calculated value of the gate charge.

Example 23. The method of any of examples 21-22 or any combination thereof, comprising: comparing, by the voltage comparator unit, a gate-source voltage across the gate and the source of the power transistor and a third threshold voltage to generate a third comparison signal; determining, by the timer unit, a third time value based on input of the transition of the input signal and input of the third comparison signal; and calculating, by the controller, a third value of a third gate charge of the power transistor based on the gate drive current, the third time value, the calculated value of the gate charge, and the calculated second value of the second gate charge.

Example 24. The method of any of examples 21-23 or any combination thereof, comprising: driving, by the gate driver, the gate of the power transistor with a second gate drive current in response to a second input signal during a time interval, wherein at least one of a value of the second gate drive current or the time interval is based on the calculated value of the gate charge.

Example 25. The method of any of examples 21-24 or any combination thereof, wherein the input signal transitions from an OFF state to an ON state to control the gate drive current to drive the gate of the power transistor and turn the power transistor ON, and wherein the voltage comparator unit generates the comparison signal when the drain-source voltage slews from an initial drain-source voltage to the threshold voltage.

Example 26. The method of any of examples 21-24 or any combination thereof, wherein the input signal transitions from an ON state to an OFF state to control the gate drive current to stop driving the gate of the power transistor and turn the power transistor OFF, and wherein the voltage comparator unit generates the comparison signal when the drain-source voltage slews from an initial drain-source voltage to the threshold voltage.

Example 27. An apparatus, comprising: means for driving a gate of a power transistor with a gate drive current in response to an input signal to control conduction between a drain and a source of the power transistor; means for comparing a drain-source voltage across the drain and the source and a threshold voltage to generate a comparison signal; means for determining a time value based on input of a transition of the input signal and input of the comparison signal; and means for calculating a value of a gate charge of the power transistor based on the gate drive current and the time value.

Example 28. The apparatus of example 27, comprising: means for comparing the drain-source voltage and a second threshold voltage to generate a second comparison signal; means for determining a second time value based on input of the transition of the input signal and input of the second comparison signal; and means for calculating a second value of a second gate charge of the power transistor based on the gate drive current, the second time value, and the calculated value of the gate charge.

Example 29. The apparatus of any of examples 27-28 or any combination thereof, comprising: means for comparing a gate-source voltage across the gate and the source of the power transistor and a third threshold voltage to generate a third comparison signal; means for determining a third time value based on input of the transition of the input signal and input of the third comparison signal; and means for calculating a third value of a third gate charge of the power transistor based on the gate drive current, the third time value, the calculated value of the gate charge, and the calculated second value of the second gate charge.

Example 30. The apparatus of any of examples 27-29 or any combination thereof, comprising: means for driving the gate of the power transistor with a second gate drive current in response to a second input signal during a time interval, wherein at least one of a value of the second gate drive current or the time interval is based on the calculated value of the gate charge.

Example 31. The apparatus of any of examples 27-30 or any combination thereof, wherein the input signal transitions from an OFF state to an ON state to control the gate drive current to drive the gate of the power transistor and turn the power transistor ON, and wherein the voltage comparator unit generates the comparison signal when the drain-source voltage slews from an initial drain-source voltage to the threshold voltage.

Example 32. The apparatus of any of examples 27-31 or any combination thereof, wherein the input signal transitions from an ON state to an OFF state to control the gate drive current to stop driving the gate of the power transistor and turn the power transistor OFF, and wherein the voltage comparator unit generates the comparison signal when the drain-source voltage slews from an initial drain-source voltage to the threshold voltage.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A device, comprising:
   a gate charge profiler circuit, comprising:
      a current input terminal configured to receive an input signal that controls a gate drive current, wherein the gate drive current drives a gate of a power transistor to control conduction between a drain and a source of the power transistor;
      a comparator input terminal configured to receive an input voltage, wherein the input voltage is:
         a drain-source voltage across the drain and the source, or
         a gate-source voltage across the gate and the source;
      a threshold voltage terminal configured to receive a threshold voltage;
      a voltage comparator unit, having a first comparator input coupled to the comparator input terminal and a second comparator input coupled to the threshold voltage terminal, and configured to generate a comparison signal based on a comparison of the input voltage and the threshold voltage; and
      a timer unit, having a first timer input coupled to the current input terminal and a second timer input coupled to a comparator output of the voltage comparator unit, and configured to determine a time value based on input of a transition of the input signal and input of the comparison signal, wherein a gate charge of the power transistor corresponds to the gate drive current and the time value.

2. The device of claim 1, wherein the input signal is a PWM signal and the timer unit starts determination of the time value based on a transition edge of the PWM signal and stops determination of the time value based on a transition edge of the comparison signal.

3. The device of claim 1, comprising:
a controller, configured to:
output the input signal to the current input terminal;
receive the time value from a timer output of the timer unit; and
calculate a value of the gate charge of the power transistor based on a product of the gate drive current and the time value.

4. The device of claim 3, wherein the controller is further configured to:
output a second input signal that controls a second gate drive current to drive the gate of the power transistor during a time interval, wherein at least one of a value of the second gate drive current or the time interval is based on the calculated value of the gate charge.

5. The device of claim 1, wherein the threshold voltage is a predetermined voltage below an initial drain-source voltage of the power transistor, and wherein the drain-source voltage slews from an initial drain-source voltage to the threshold voltage as the gate drive current drives the gate of the power transistor to turn the power transistor ON.

6. The device of claim 1, wherein the threshold voltage is a predetermined voltage above a ground voltage coupled to the source of the power transistor, and wherein the drain-source voltage slews from an initial drain-source voltage to the threshold voltage and the gate-source voltage maintains a gate plateau voltage as the gate drive current drives the gate of the power transistor to turn the power transistor ON.

7. The device of claim 1, wherein the threshold voltage is a predetermined voltage below a configured gate drive voltage of the power transistor, and wherein the gate-source voltage slews from an initial gate-source voltage to the configured gate drive voltage as the gate drive current drives the gate of the power transistor to turn the power transistor ON.

8. The device of claim 1,
wherein the threshold voltage terminal is further configured to receive a second threshold voltage and a third threshold voltage;
wherein the voltage comparator unit is further configured to:
generate a second comparison signal based on a comparison of the input voltage and the second threshold voltage; and
generate a third comparison signal based on a comparison of the input voltage and the third threshold voltage;
wherein the timer unit is further configured to:
determine a second time value based on input of the transition of the input signal and input of the second comparison signal; and
determine a third time value based on input of the transition of the input signal and input of the third comparison signal; and
wherein a second gate charge of the power transistor corresponds to the gate drive current and the second time value, and a third gate charge of the power transistor corresponds to the gate drive current and the third time value.

9. The device of claim 8, comprising:
a controller, configured to:
output the input signal to the current input terminal;
receive the time value, the second time value, and the third time value from a timer output of the timer unit;
calculate a value of the gate charge based on the gate drive current and the time value;
calculate a second value of the second gate charge based on the gate drive current and the second time value; and
calculate a third value of the third gate charge based on the gate drive current and the third time value.

10. The device of claim 9, wherein the controller is further configured to:
calculate the value of the gate charge by multiplying the gate drive current and the time value;
calculate the second value of the second gate charge by multiplying the gate drive current and the second time value to obtain a first product, and subtracting the calculated value of the gate charge from the first product; and
calculate the third value of the third gate charge by multiplying the gate drive current and the third time value to obtain a second product, and subtracting the calculated value of the gate charge and the calculated second value of the second gate charge from the second product.

11. The device of claim 1, comprising a controller configured to:
output one or more additional input signals that control one or more gate drive currents to drive the gate of the power transistor.

12. The device of claim 8, wherein the voltage comparator unit is further configured to:
generate the comparison signal when the drain-source voltage equals the threshold voltage;
generate the second comparison signal when the drain-source voltage equals the second threshold voltage; and
generate the third comparison signal when the gate-source voltage equals the third threshold voltage.

13. The device of claim 1,
wherein the input signal transitions from an OFF state to an ON state to control the gate drive current to drive the gate of the power transistor and turn the power transistor ON, and
wherein the voltage comparator unit generates the comparison signal when the input voltage slews from an initial input voltage to the threshold voltage.

14. The device of claim 1,
wherein the input signal transitions from an ON state to an OFF state to control the gate drive current to stop driving the gate of the power transistor and turn the power transistor OFF, and
wherein the voltage comparator unit generates the comparison signal when the input voltage slews from an initial input voltage to the threshold voltage.

15. A gate charge profiler system, comprising:
a power transistor comprising a gate that controls conduction between a drain and a source;
a gate driver configured to drive the gate of the power transistor with a gate drive current in response to an input signal;
a gate charge profiler, comprising:
an analog comparator configured to generate a comparison signal when a drain-source voltage across the drain and the source equals a threshold voltage; and
a timer arranged subsequent to the analog comparator and configured to output a time value based on input of a transition of the input signal and input of the comparison signal; and a controller, configured to:
- output the input signal to the gate driver and the timer; and
- calculate a value of a gate charge of the power transistor based on the gate drive current and the time value.

16. The gate charge profiler system of claim 15,
the gate charge profiler further comprising:
- a second analog comparator configured to generate a second comparison signal when the drain-source voltage equals a second threshold voltage; and
- a second timer arranged subsequent to the second analog comparator and configured to output a second time value based on input of the transition of the input signal and input of the second comparison signal; and the controller further configured to:
- calculate a second value of a second gate charge of the power transistor based on the gate drive current and the second time value.

17. The gate charge profiler system of claim 16,
the gate charge profiler further comprising:
- a third analog comparator configured to generate a third comparison signal when a gate-source voltage across the gate and the source equals a third threshold voltage; and
- a third timer arranged subsequent to the third analog comparator and configured to output a third time value based on input of the transition of the input signal and input of the third comparison signal; and the controller further configured to:
- calculate a third value of a third gate charge of the power transistor based on the gate drive current and the third time value.

18. The gate charge profiler system of claim 17,
the controller further configured to:
- calculate the value of the gate charge as a function of one or more gate drive currents and one or more time values.

19. The gate charge profiler system of claim 15,
wherein the input signal transitions from an OFF state to an ON state to control the gate drive current to drive the gate of the power transistor and turn the power transistor ON, and
wherein the analog comparator generates the comparison signal when the drain-source voltage slews from an initial drain-source voltage to the threshold voltage.

20. The gate charge profiler system of claim 15,
wherein the input signal transitions from an ON state to an OFF state to control the gate drive current to stop driving the gate of the power transistor and turn the power transistor OFF, and
wherein the analog comparator generates the comparison signal when the drain-source voltage slews from an initial drain-source voltage to the threshold voltage.

21. A method, comprising:
- driving, by a gate driver, a gate of a power transistor with a gate drive current in response to an input signal to control conduction between a drain and a source of the power transistor;
- comparing, by a voltage comparator unit, a drain-source voltage across the drain and the source and a threshold voltage to generate a comparison signal;
- determining, by a timer unit, a time value based on input of a transition of the input signal and input of the comparison signal; and
- calculating, by a controller, a value of a gate charge of the power transistor based on the gate drive current and the time value.

22. The method of claim 21, comprising:
- comparing, by the voltage comparator unit, the drain-source voltage and a second threshold voltage to generate a second comparison signal;
- determining, by the timer unit, a second time value based on input of the transition of the input signal and input of the second comparison signal; and
- calculating, by the controller, a second value of a second gate charge of the power transistor based on the gate drive current, the second time value, and the calculated value of the gate charge.

23. The method of claim 22, comprising:
- comparing, by the voltage comparator unit, a gate-source voltage across the gate and the source of the power transistor and a third threshold voltage to generate a third comparison signal;
- determining, by the timer unit, a third time value based on input of the transition of the input signal and input of the third comparison signal; and
- calculating, by the controller, a third value of a third gate charge of the power transistor based on the gate drive current, the third time value, the calculated value of the gate charge, and the calculated second value of the second gate charge.

24. The method of claim 21, comprising:
- driving, by the gate driver, the gate of the power transistor with a second gate drive current in response to a second input signal during a time interval, wherein at least one of a value of the second gate drive current or the time interval is based on the calculated value of the gate charge.

25. The method of claim 21,
wherein the input signal transitions from an OFF state to an ON state to control the gate drive current to drive the gate of the power transistor and turn the power transistor ON, and
wherein the voltage comparator unit generates the comparison signal when the drain-source voltage slews from an initial drain-source voltage to the threshold voltage.

26. The method of claim 21,
wherein the input signal transitions from an ON state to an OFF state to control the gate drive current to stop driving the gate of the power transistor and turn the power transistor OFF, and
wherein the voltage comparator unit generates the comparison signal when the drain-source voltage slews from an initial drain-source voltage to the threshold voltage.

* * * * *